(12) United States Patent
Kushibiki et al.

(10) Patent No.: US 8,241,511 B2
(45) Date of Patent: Aug. 14, 2012

(54) SUBSTRATE PROCESSING METHOD

(75) Inventors: Masato Kushibiki, Nirasaki (JP); Eiichi Nishimura, Nirasaki (JP)

(73) Assignee: Tokyo Electron Limited (JP)

( * ) Notice: Subject to any disclaimer, the term of this patent is extended or adjusted under 35 U.S.C. 154(b) by 717 days.

(21) Appl. No.: 12/442,075

(22) PCT Filed: Oct. 9, 2008

(86) PCT No.: PCT/JP2008/068806
§ 371 (c)(1),
(2), (4) Date: Mar. 19, 2009

(87) PCT Pub. No.: WO2009/048165
PCT Pub. Date: Apr. 16, 2009

(65) Prior Publication Data
US 2010/0173493 A1    Jul. 8, 2010

Related U.S. Application Data

(60) Provisional application No. 61/017,262, filed on Dec. 28, 2007.

(30) Foreign Application Priority Data

Oct. 11, 2007  (JP) ................................ 2007-265596
Apr. 15, 2008  (JP) ................................ 2008-105784

(51) Int. Cl.
*B44C 1/22* (2006.01)
*C03C 15/00* (2006.01)
*C03C 25/68* (2006.01)
*C23F 1/00* (2006.01)

(52) U.S. Cl. ............. 216/46; 438/696; 438/700; 216/41
(58) Field of Classification Search .................... 216/46, 216/41; 438/696, 700
See application file for complete search history.

(56) References Cited

U.S. PATENT DOCUMENTS 6,225,184 B1 *  5/2001  Hayashi et al. ............... 438/396

FOREIGN PATENT DOCUMENTS

JP             63-155621             6/1988
(Continued)

OTHER PUBLICATIONS

International Search Report-PCT/JP2008/068806 dated Sep. 12, 2008.
Written Opinion-PCT/JP2008/068806 dated Sep. 12, 2008. Notice of Grounds of Rejection issued by Japan Patent Office on Nov. 24, 2010, Japan Patent Application No. 2008-105784, citing JP10-312991, JP07-130680 and JP11-261025.

(Continued)

*Primary Examiner* — Roberts Culbert
(74) *Attorney, Agent, or Firm* — Cantor Colburn LLP

(57) ABSTRACT

The present invention provides a substrate processing method to process a substrate including at least a process layer, an intermediate layer, and a mask layer which are stacked in this order. The mask layer includes an aperture configured to expose a portion of the intermediate layer. The substrate processing method includes a material deposition step of depositing a material on a side surface of the aperture and exposing a portion of the process layer by etching the exposed portion of the intermediate layer by plasma generated from a deposit gas, and an etching step of etching the exposed portion of the process layer.

7 Claims, 10 Drawing Sheets

FOREIGN PATENT DOCUMENTS

| | | |
|---|---|---|
| JP | 07-130680 | 5/1995 |
| JP | 10-312991 | 11/1998 |
| JP | 11-261025 | 9/1999 |
| JP | 2006-190939 | 7/2006 |
| JP | 2007-503720 | 2/2007 |
| WO | 2006/083592 | 8/2006 |

OTHER PUBLICATIONS

Notice of Preliminary Rejection issued by the Korean Patent Office on Jan. 6, 2011, citing JP10-312991 and JP07-130680, which were previously submitted.

* cited by examiner

SUBSTRATE PROCESSING METHOD

TECHNICAL FIELD

The present invention relates to a substrate processing method, and more specifically, to a substrate processing method to process a substrate including at least a process layer, an intermediate layer, and a mask layer which are stacked in this order.

BACKGROUND ART

As a conventional wafer for a semiconductor device, there is a wafer including an oxide film including an impurity (such as a TEOS (Tetra Ethyl Ortho Silicate) film), which is formed by a CVD process or the like, a conductive film (such as a TiN film), a reflection preventive film (BARC film), and a photoresist film which are stacked in this order over a silicon substrate by a CVD process or the like (for example, see Patent Document 1). A photoresist film is formed in a predetermined pattern by photolithography to serve as a mask when etching the reflection preventive film and the conductive film.

In recent years, as semiconductor devices are further downsized, there is a growing demand for forming more minute circuit patterns over the wafer as described above. To form such minute circuit patterns, small size apertures (via holes or trenches) are required to be formed in a film for use in etching, by scaling down the minimum size of a pattern formed in a photoresist film when manufacturing the semiconductor device.

[Patent Document 1] Japanese Patent Application Publication No. 2006-190939

The minimum size of a pattern formed in a photoresist film is defined by the minimum possible size realized by photolithography. However, due to variations of focal distance or the like, there is a limit in the minimum possible size developed by photolithography. For example, the minimum possible size developed by photolithography is 80 nm, although a process size of about 30 nm is required to satisfy the demand for downsizing the semiconductor devices.

Therefore, it was conventionally impossible to form apertures in a film to be etched, which have a size to satisfy the demand for downsizing the semiconductor devices.

DISCLOSURE OF INVENTION

It is an object of at least one embodiment of the invention to provide a substrate processing method by which apertures having a size to satisfy the demand for downsizing the semiconductor devices can be formed in a film to be etched.

According to one aspect of the invention, the present invention provides a substrate processing method to process a substrate including at least a process layer, an intermediate layer, and a mask layer stacked in this order. The mask layer includes an aperture configured to expose a portion of the intermediate layer. The substrate processing method includes a material deposition step of depositing material on a side surface of the aperture and exposing a portion of the process layer by etching the exposed portion of the intermediate layer by plasma generated from a deposit gas, and an etching step of etching the exposed portion of the process layer.

According to another aspect of the invention, a substrate processing method to process a substrate including at least a base layer, a process layer, a first intermediate layer, and a first mask layer stacked in this order, the first mask layer includes a first aperture configured to expose a portion of the first intermediate layer. The substrate processing method includes a first material deposition step of depositing a material on a side surface of the first aperture and exposing a portion of the process layer by etching the exposed portion of the first intermediate layer by plasma generated from a deposit gas, a first etching step of forming a second aperture configured to expose a portion of the base layer by etching the exposed portion of the process layer, an ashing step of ashing the first intermediate layer and the first mask layer which are stacked over the process layer, a layer stacking step of stacking a second intermediate layer and a second mask layer in this order, the second mask layer has a third aperture configured to expose a portion of the second intermediate layer except for over the second aperture, a second material deposition step of depositing a material on a side surface of the third aperture and exposing another portion of the process layer by etching the second intermediate layer which is exposed by another plasma generated from another deposit gas, and a second etching step of etching said another exposed portion of the process layer.

According to another aspect of the invention, a substrate processing method to process a substrate including at least a process layer, an intermediate layer, and a mask layer stacked in this order and the mask layer includes an aperture configured to expose a portion of the intermediate layer. The substrate processing method includes an intermediate layer anisotropic etching step of applying anisotropic etching in a direction of a thickness to the exposed portion of the intermediate layer to expose the process layer, an intermediate layer isotropic etching step of applying isotropic etching to the side surface of the intermediate layer, which is exposed by the anisotropic etching, to narrow a width of the intermediate layer, a mask layer removing step of removing the mask layer, a covering layer forming step of forming a covering layer configured to cover the exposed portion of the process layer and the intermediate layer with the narrowed width, a covering layer removing step of removing a predetermined amount of the covering layer to expose only the intermediate layer with the narrowed width, an intermediate layer removing step of selectively removing only the exposed intermediate layer to partially expose the process layer, and a process layer etching step of applying anisotropic etching to the exposed process layer in a direction of a thickness. The mask layer is left with a predetermined thickness over the intermediate layer when the intermediate layer isotropic etching step starts.

According to another aspect of the invention, a substrate processing method to process a substrate including at least a process layer, a first intermediate layer, a second intermediate layer, a third intermediate layer, and a mask layer stacked in this order, the mask layer includes an aperture configured to expose a portion of the third intermediate layer. The substrate processing method includes a material deposition step of depositing a material on a side surface of the aperture and exposing a portion of the second intermediate layer by etching the exposed portion of the third intermediate layer by plasma generated from a deposit gas, an intermediate layer anisotropic etching step of applying anisotropic etching in a direction of a thickness to the exposed portion of the second intermediate layer and to the first intermediate layer through the aperture of the mask layer to expose the process layer, an intermediate layer isotropic etching step of applying isotropic etching to a side surface of the second intermediate layer, which is exposed by the anisotropic etching, to narrow a width of the second intermediate layer, a third intermediate layer removing step of removing the mask layer and the third intermediate layer, a covering layer forming step of forming a covering layer configured to cover the exposed process layer, the first intermediate layer, and the second intermediate layer with the narrowed width, a covering layer removing step of removing a predetermined amount of the covering layer to expose only the second intermediate layer with the narrowed width, a second intermediate layer removing step of selectively removing only the exposed second intermediate layer to partially expose the first intermediate layer, a first intermediate layer etching step of applying anisotropic etching in a direction of a thickness to the exposed first intermediate layer to expose the process layer, a covering layer complete removing step of completely removing the covering layer to expose the process layer covered with the covering layer, and a process layer etching step of applying anisotropic etching in a direction of a thickness to the process layer which is exposed in the first intermediate layer etching step and the covering layer removing step. At least the third intermediate layer is left with a predetermined thickness over the second intermediate layer when the intermediate layer isotropic etching step starts.

According to another aspect of the invention, a substrate processing method to process a substrate including at least a process layer, a first intermediate layer, a second intermediate layer, a third intermediate layer, and a mask layer are stacked in this order, the mask layer includes an aperture configured to expose a portion of the third intermediate layer. The substrate processing method includes a first covering layer forming step of forming a first covering layer to cover the mask layer and the exposed portion of the third intermediate layer in an isotropic manner, a first covering layer etching step of applying anisotropic etching in a direction of a thickness to the first covering layer to expose the third intermediate layer again, leaving the first covering layer on a side surface of the aperture, an intermediate layer anisotropic etching step of applying anisotropic etching in a direction of a thickness to the exposed third intermediate layer, the second intermediate layer, and the first intermediate layer through the aperture of the mask layer to expose the process layer and remove the mask layer, an intermediate layer isotropic etching step of applying isotropic etching to a surface of the second intermediate layer, which is exposed by the anisotropic etching, to narrow a width of the second intermediate layer, a third intermediate layer removing step of removing the third intermediate layer, a second covering layer forming step of forming a second covering layer to cover the exposed process layer, the first intermediate layer, and the second intermediate layer with the narrowed width, a second covering layer removing step of removing a predetermined amount of the second covering layer to expose only the second intermediate layer with the narrowed width, a second intermediate layer removing step of selectively removing only the exposed second intermediate layer to partially expose the first intermediate layer, a first intermediate layer etching step of applying anisotropic etching in a direction of a thickness to the exposed first intermediate layer to expose the process layer, a second covering layer complete removing step of completely removing the second covering layer to expose the process layer covered with the second covering layer, and a process layer etching step of applying anisotropic etching in a direction of a thickness to the process layer exposed in the first intermediate etching step and the second covering layer complete removing step. At least the third intermediate layer is left with a predetermined thickness over the second intermediate layer when the intermediate layer isotropic etching step starts.

According to at least one embodiment, an intermediate layer exposed by plasma generated from a deposit gas is etched, thereby a portion of a process layer is exposed and a material is deposited on a side surface of an aperture of a mask layer. After that, the exposed process layer is etched. When the material is deposited on the side surface of the aperture, a width of the aperture of the mask layer becomes narrower. As a result, an aperture with a narrow width can be formed in the process layer. For example, by depositing a material on the side surface of the aperture of the mask layer so that the aperture has a width of 30 nm, an aperture with a width of 30 nm can be formed in the process layer. Consequently, an aperture with a size satisfying the demand for downsizing of semiconductor devices can be formed in an etched film.

According to at least one embodiment, a first intermediate layer exposed by plasma generated from a deposit gas is etched, thereby a portion of the process layer is exposed and a material is deposited on a side surface of a first aperture of a first mask layer. Then, the process layer having an exposed portion is etched, thereby a second aperture is formed. The first intermediate layer and the first mask layer stacked over the process layer undergo asking. Then a second intermediate layer and a second mask layer having a third aperture to expose a portion of the second intermediate layer, which is not formed over the second aperture are stacked in this order over the substrate. The exposed second intermediate layer is etched by the plasma generated from the deposit gas, thereby another portion of the process layer is exposed. At the same time, the material is deposited on the side surface of the third aperture in the second mask layer. After that, the process layer having said exposed portion is etched. Therefore, an aperture with a size satisfying the demand for downsizing the semiconductor devices can be formed in addition to the second aperture formed by etching the exposed portion in the process layer, besides the effects described in the disclosure of the present invention. As a result, the apertures can be formed in the process layer with a narrower pitch.

According to at least one embodiment, isotropic etching is applied to the side surface of the intermediate layer, which is exposed by anisotropic etching, thereby a width of the intermediate layer is reduced. By removing a predetermined amount of a covering layer which covers the process layer and the intermediate layer with a narrowed width, only the intermediate layer with the narrowed width is exposed. Further, by selectively removing the intermediate layer with the narrowed width, an aperture with a narrow width which partially exposes the process layer is formed in the covering layer. Then, anisotropic etching is applied to the process layer through this aperture. Therefore, since the aperture with a narrow width can be formed in the process layer, an aperture with a size satisfying the demand for downsizing the semiconductor device can be formed in an etched film.

According to at least one embodiment, anisotropic etching is applied to the first intermediate layer through an aperture of the mask film, of which width is narrowed by the deposition of the material on the side surface. As a result, a first aperture with a narrow width is formed in the first intermediate layer. Further, isotropic etching is applied to the side surface of the second intermediate layer of which side surface is exposed by anisotropic etching, thereby a width of the second intermediate layer is reduced. By removing a predetermined amount of a covering layer which covers the process layer, the first intermediate layer, and the second intermediate layer with a narrowed width, only the second intermediate layer with a narrowed width is exposed. By selectively removing the second intermediate layer with the narrowed width, an aperture with a narrow width to partially expose the first intermediate layer is formed in the covering layer. Then, anisotropic etching is applied to the first intermediate layer through the aperture of the covering layer, thereby a second aperture with a narrow width is formed in the first intermediate layer. Then, anisotropic etching is applied to the process layer through the first and second apertures. Therefore, an aperture with a narrow width can be formed in the process layer, thereby an aperture with a size satisfying the demand for downsizing the semiconductor devices can be formed in an etched film.

According to at least one embodiment, anisotropic etching is applied to a first intermediate layer through an aperture of a mask layer with a width narrowed by the first covering layer left on the side surface, thereby a first aperture with a narrowed width is formed in the first intermediate layer. Further, isotropic etching is applied to the side surface of the second intermediate layer of which side surface is exposed by the anisotropic etching, thereby a width of the second intermediate layer is reduced. By removing a predetermined amount of a second covering layer which covers the process layer, the first intermediate layer, and the second intermediate layer with a narrowed width, only the second intermediate layer with a narrowed width is exposed. By selectively removing the second intermediate layer with the narrowed width, an aperture with a narrow width to partially expose the first intermediate layer is formed in the second covering layer. Anisotropic etching is applied to the first intermediate layer through the aperture of the second covering layer, thereby a second aperture with a narrow width is formed in the first intermediate layer. Then, anisotropic etching is applied to the process layer through the first and second apertures. Therefore, the aperture with the narrow width can be formed in the process layer, thereby the aperture with a size satisfying the demand for downsizing the semiconductor devices can be formed in an etched film.

BEST MODE FOR CARRYING OUT THE INVENTION

A description of embodiments of the present invention will now be given with reference to the drawings.

First, a description is made on a substrate processing system which is configured to perform a substrate processing method of a first embodiment of the invention. This substrate processing system includes plural process modules configured to apply an etching treatment or an asking treatment by applying plasma to a semiconductor wafer W (hereinafter simply called a "wafer W") serving as a substrate.

Figure 1:
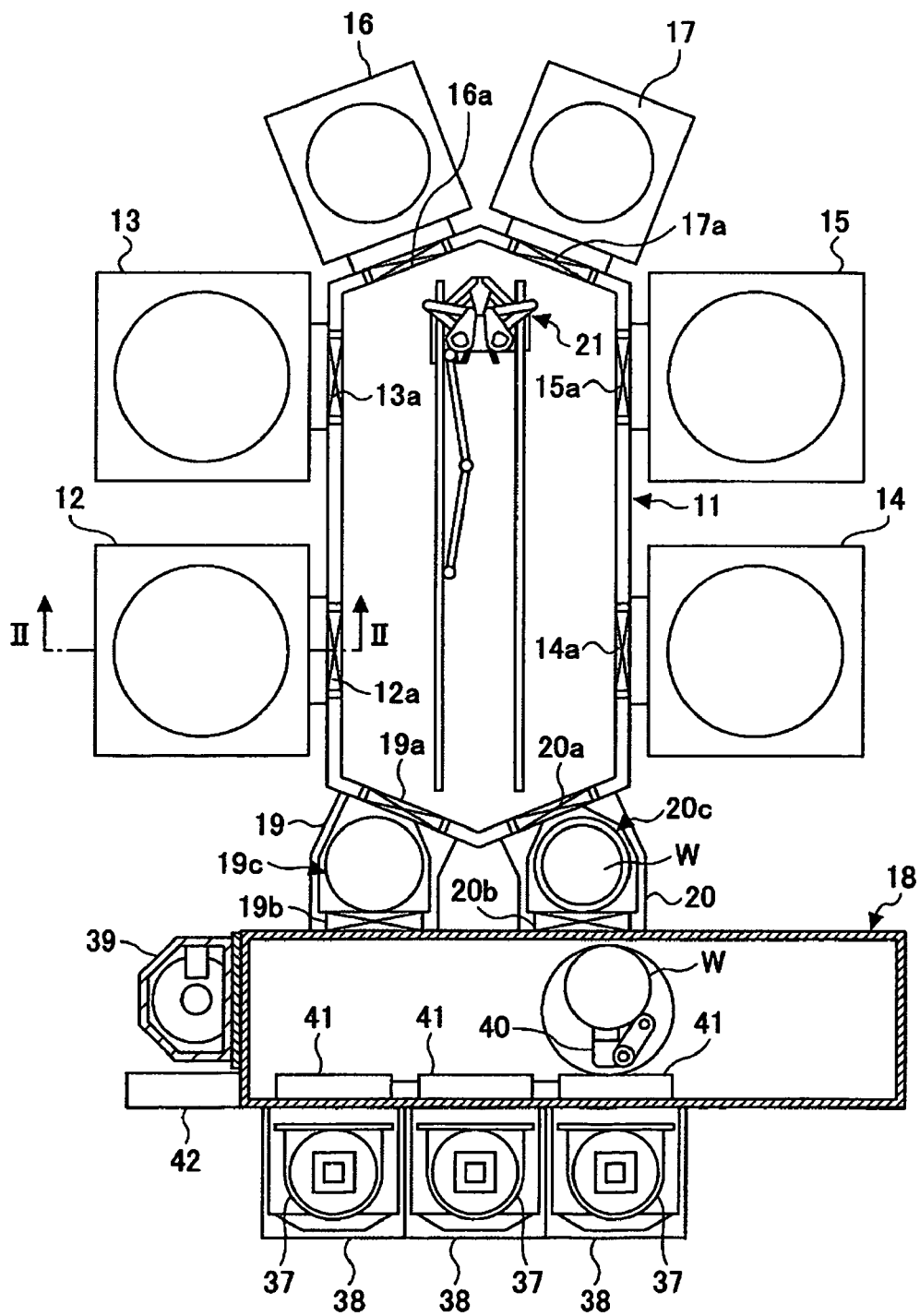
FIG. 1 is a plan view showing a schematic structure of a substrate processing system which is configured to perform a substrate processing method of a first embodiment of the invention.

FIG. 1 is a plan view showing a schematic structure of the substrate processing system which is configured to perform the substrate processing method of this embodiment.

In FIG. 1, a substrate processing system 10 includes a transfer module 11 in a hexagon plan shape, two process modules 12 and 13 connected to one side of the transfer module 11, two process modules 14 and 15 connected to the other side of the transfer module 11 so as to oppose to the two process modules 12 and 13 respectively, a process module 16 provided adjacent to the process module 13 and connected to the transfer module 11, a process module 17 provided adjacent to the process module 15 and connected to the transfer module 11, a loader module 18 as a rectangular transport chamber, and two load-lock modules 19 and 20 provided between the transfer module 11 and the loader module 18.

A transport arm 21 capable of bending, stretching, and pivoting is provided in the transfer module 11. The transport arm 21 transports the wafer W among the process modules 12 to 17 and the load-lock modules 19 and 20.

The process module 12 includes a chamber to hold the wafer W. A mixed gas of a CF-based deposit gas such as a $CHF_3$ gas and a halogen-based gas such as a HBr gas is introduced as a process gas into the chamber. By generating an electric field in the chamber, plasma is generated from the introduced process gas. The wafer W is etched by this plasma.

Figure 2:
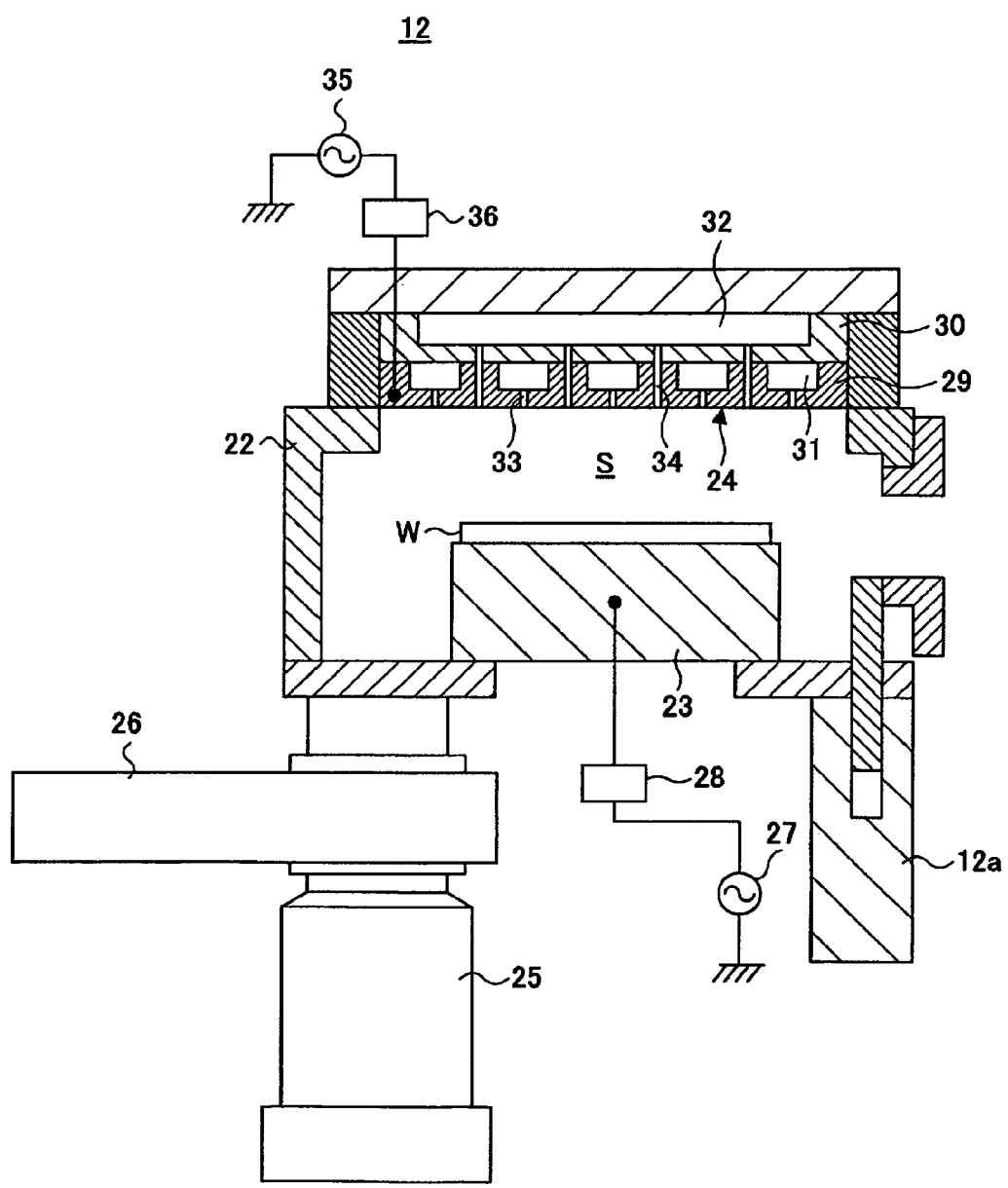
FIG. 2 is a cross-sectional view taken along a line II-II in FIG. 1.

FIG. 2 is a cross-sectional view taken along a line II-II in FIG. 1.

In FIG. 2, the process module 12 includes a chamber 22, a mounting stage 23 for the wafer W, which is provided in the chamber 22, a shower head 24 provided to face the mounting stage 23 on an upper side of the chamber 22, a TMP (Turbo Molecular Pump) 25 which evacuates a gas or the like in the chamber 22, and an APC (Adaptive Pressure Control) valve 26 which is provided between the chamber 22 and the TMP 25 to serve as a variable butterfly valve which controls a pressure in the chamber 22.

A high frequency power source 27 is connected to the mounting stage 23 through a matcher 28. The high frequency power source 27 supplies a high frequency power to the mounting stage 23. As a result, the mounting stage 23 functions as a lower electrode. Further, the matcher 28 maximizes an efficiency of the high frequency power supply to the mounting stage 23 by reducing the high frequency power reflected by the mounting stage 23. The high frequency power supplied from the high frequency power source 27 is applied to a process space S by the mounting stage 23.

The shower head 24 is formed of a lower side gas supplier 29 in a disc shape and an upper side gas supplier 30 in a disc shape. The upper side gas supplier 30 is overlapped over the lower side gas supplier 29. Further, the lower side gas supplier 29 and the upper side gas supplier 30 have a first buffer chamber 31 and a second buffer chamber 32 respectively. The first buffer chamber 31 and the second buffer chamber 32 are in communication with the chamber 22 through gas vents 33 and 34 respectively.

The first buffer chamber 31 is connected to a $CHF_3$ gas supply system (not shown). The $CHF_3$ gas supply system supplies a $CHF_3$ gas to the first buffer chamber 31. The $CHF_3$ gas supplied from the $CHF_3$ gas supply system is supplied through the gas vent 33 into the chamber 22. The second buffer chamber 32 is connected to a HBr gas supply system (not shown). The HBr gas supply system supplies a HBr gas to the second buffer chamber 32. The HBr gas supplied from the HBr gas supply system is supplied through the gas vent 34 into the chamber 22.

A high frequency power source 35 is connected to the shower head 24 through a matcher 36. The high frequency power source 35 supplies a high frequency power source to the shower head 24. As a result, the shower head 24 functions as an upper electrode. The matcher 36 functions similarly to the matcher 28. The high frequency power supplied from the high frequency power source 35 is applied to the process space S by the shower head 24.

In the chamber 22 of this process module 12, the high frequency power is applied into the process space S by the mounting stage 23 and the shower head 24 as described above. High density plasma is generated from the process gas supplied from the shower head 24 into the process space S to generate ions and radicals. The wafer W is etched by the generated ions and radicals.

An endpoint detector (not shown) including an electron microscope is provided in the shower head 24 to detect an endpoint of etching applied to the wafer W by observing the wafer W mounted on the mounting stage 23 from above.

The process module 13 in FIG. 1 includes a chamber to hold the wafer W which underwent etching in the process module 12. A mixed gas of a $Cl_2$ gas and a $N_2$ gas is introduced as a process gas to the chamber. By generating an electric field in the chamber, plasma is generated from the introduced process gas. The wafer W is etched by this plasma. The process module 13 has a similar structure to the process module 12 and includes a $Cl_2$ gas supply system and a $N_2$ gas supply system (both not shown) instead of the $CHF_3$ gas supply system and the HBr gas supply system.

The process module 14 includes a chamber to hold the wafer W which underwent etching in the process module 13. An $O_2$ gas is introduced as a process gas into the chamber. By generating an electric field in the chamber, plasma is generated from the introduced gas. An asking treatment is applied to the wafer W by the generated plasma. The process module 14 also has a similar structure to the process module 12 and includes a shower head formed only of a gas supplier in a disc shape, which is an $O_2$ gas supply system connected to a buffer chamber, instead of the shower head 24 formed of the lower side gas supplier 29 in a disc shape and the upper side gas supplier 30 in a disc shape.

Internal pressures of the transfer module 11 and the process modules 12 to 17 are kept at a reduced pressure. The transfer module 11 and each of the process modules 12 to 17 are connected through vacuum gate valves 12a to 17a respectively.

In the substrate processing system 10, an internal pressure of the loader module 18 is kept at an atmospheric pressure, while an internal pressure of the transfer module 11 is kept in a vacuum. Therefore, each of the load-lock modules 19 and 20 includes vacuum gate valves 19a and 20a at connections with the transfer module 11 respectively and atmospheric door valves 19b and 20b at connections with the loader module 18 respectively. As a result, the load-lock modules 19 and 20 serve as spare vacuum chambers of which internal pressures can be controlled. Further, the load-lock modules 19 and 20 have wafer mounting stages 19c and 20c respectively for temporarily mounting the wafer W transported between the loader module 18 and transfer module 11.

In addition to the load-lock modules 19 and 20, three FOUP (Front Opening Unified Pod) mounting stages 38 on which FOUPs 37 as containers are mounted to hold 25 wafers W, and an orienter 39 which pre-aligns a position of the wafer W carried out from the FOUPs 37 are connected to the loader module 18.

The load-lock modules 19 and 20 are connected to a side wall in a longitudinal direction of the loader module 18 and arranged so as to oppose to the three FOUP mounting stages 38 with the loader module 18 located between the FOUP mounting stages 38 and the load-lock modules 19 and 20.

The loader module 18 includes a scalar type dual transport arm 40 to transport the wafer W, and three load-ports 41 arranged on a side wall of the loader module 18 so as to correspond to each FOUP mounting stage 38 to serve as slots to insert the wafer W. The transport arm 40 takes out the wafer W from the FOUP 37 mounted on the FOUP mounting stage 38 through the load-port 41 and transports the wafer W to the load-lock modules 19 and 20 or the orienter 39.

The substrate processing system 10 includes an operation panel 42 provided at one end of the longitudinal direction side of the loader module 18. The operation panel 42 has a display formed of, for example, an LCD (Liquid Crystal Display) to display an operation state of each component in the substrate processing system 10.

Figure 3A:
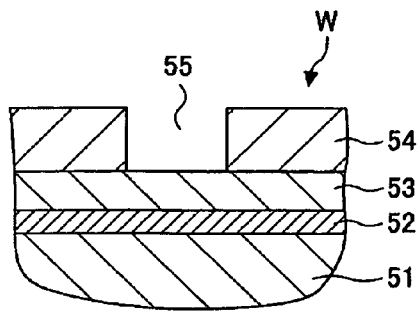
FIGS. 3A to 3G are process drawings of the substrate processing method realized by the substrate processing system of FIG. 1.

FIG. 3A is a cross-sectional view showing a schematic structure of a semiconductor wafer to which a plasma treatment is applied in the substrate processing system shown in FIG. 1.

In FIG. 3A, the wafer W includes a TEOS (Tetra Ethyl Ortho Silicate) film 51 (base layer) formed over a silicon substrate (not shown), a TiN film 52 formed over the TEOS film 51, a reflection preventive film (BARC film) 53 (intermediate layer, first intermediate layer) formed over the TiN film 52, and a photoresist film 54 (mask layer, first mask layer) formed over the reflection preventive film 53.

The silicon substrate is a thin plate in a disc shape and formed of silicon. A CVD treatment or the like is applied to the silicon substrate, thereby the TEOS film 51 is formed over the surface of the silicon substrate. The TEOS film 51 which is an oxide film including an impurity serves as an insulating film. A CVD treatment, a PVD treatment or the like is applied to the TEOS film 51 to form the TiN film 52 over the surface of the TEOS film 51. The TiN film 52 serves as a conductive film. The reflection preventive film 53 is formed of a polymer resin including a pigment which absorbs light in a specific wavelength, for example, ArF excimer laser light emitted to the photoresist film 54. The reflection preventive film 53 prevents the ArF excimer laser light transmitted through the photoresist film 54 from being reflected by the TiN film 52 and reaching the photoresist film 54 again. The photoresist film 54 is formed of a positive type photosensitive resin, which changes to be alkali soluble when irradiated with the ArF excimer laser light.

After the reflection preventive film 53 is formed by an application process or the like over the wafer W, the photoresist film 54 is formed by using a spin coater (not shown). Further, the photoresist film 54 is irradiated with ArF excimer laser light corresponding to a reverse pattern of a predetermined pattern by a stepper (not shown), thereby the photoresist film 54 of a portion irradiated with the ArF excimer laser light becomes alkali soluble. After that, a strong alkaline developer is deposited on the photoresist film 54, thereby the photoresist film 54 of the portion which has become alkali soluble is removed. As a result, the portion of the photoresist film 54, which corresponds to the reverse pattern of the predetermined pattern is removed. Therefore, the photoresist film 54 having the predetermined pattern, for example, the photoresist film 54 having an aperture 55 (first aperture) at a position for forming a via hole is left over the wafer W.

To satisfy the demand for downsizing the semiconductor devices, it is required to form an aperture (via hole or trench) with a narrow width in a film to be etched, which is a width (CD (Critical Dimension) value) of about 30 nm, to be specific. However, the minimum possible size developed by photolithography is 80 nm, therefore, it is impossible to form the aperture with the width of about 30 nm in a film to be etched in etching the wafer W.

To find a method to form an aperture having the demanded width, the present inventors found out through various experiments that by etching the exposed reflection preventive film 53 with plasma generated from a $CHF_3$ gas as a CF-based deposit gas to expose a portion of the TiN film 52, and then exposing the aperture 55 to the generated plasma, a material is deposited on a side surface of the aperture 55, which narrows a width of the aperture 55.

Moreover, the present inventors presumed from the aforementioned finding that the width of the aperture 55 would become narrower as the aperture 55 is exposed to the generated plasma longer. By measuring the width of the aperture 55 with the length of time the aperture 55 is exposed to plasma used as a parameter, the inventors found out that the width of the aperture 55 becomes smaller at a predetermined rate as the aperture 55 is exposed to plasma longer, and the width of the aperture 55 becomes as narrow as 30 nm. Thus, the inventors found out that the width of the aperture 55 can be controlled to be 30 nm by controlling the length of time that the aperture 55 after etching the reflection preventive film 53 is exposed to the plasma.

Hereinafter, a description is made on a substrate processing method of this embodiment.

FIGS. 3A to 3G are process diagrams showing a substrate processing method realized by the substrate processing system of FIG. 1.

First, the TEOS film 51, the TiN film 52 as a process layer, the reflection preventive film 53, and the photoresist film 54 are stacked in this order over a silicon substrate, which corresponds to the wafer W in which the aperture 55 exposing a portion of the reflection preventive film 53 is formed in the photoresist film 54 (FIG. 3A). The wafer W is transported into the chamber 22 in the process module 12 and mounted on the mounting stage 23.

Figure 3B:
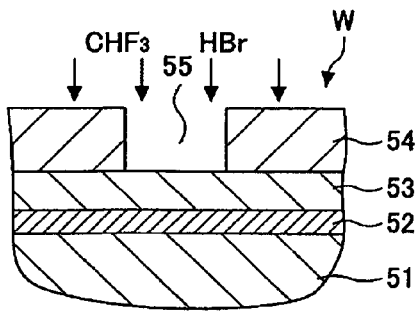
Figure 3C:
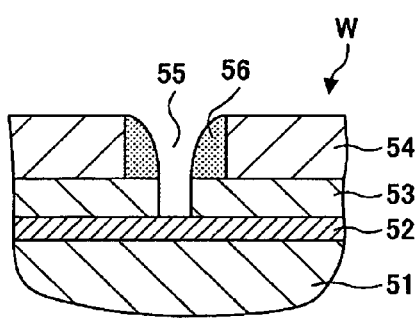
Figure 3D:
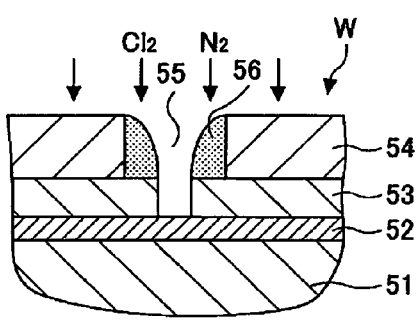

Subsequently, an internal pressure of the chamber 22 is set at 2.6 Pa (20 mTorr) by using an APC valve 26 or the like. A $CHF_3$ gas is supplied from the lower side gas supplier 29 of the shower head 24 into the chamber 22 at a flow rate of 100 to 300 sccm, or preferably 200 sccm. At the same time, a HBr gas is supplied from the upper side gas supplier 30 into the chamber 22 at a flow rate of 300 sccm or lower, or preferably 100 sccm. A high frequency power of 100 W is supplied to the mounting stage 23 and a high frequency power of 600 W is supplied to the shower head 24. At this time, the $CHF_3$ gas and the HBr gas turn to plasma by the high frequency power applied to the process space S, thereby ions and radicals are generated. These ions and radicals collide and react with the reflection preventive film 53 of a portion which is not covered with the photoresist film 54 and etch this uncovered portion (FIG. 3B). The reflection preventive film 53 is etched until the TiN film 52 is exposed. At this time, the endpoint detector provided in the shower head 24 detects an endpoint of etching of the reflection preventive film 53 of this uncovered portion. After detecting the endpoint, the aperture 55 of the photoresist film 54 continues to be exposed to the plasma. At this time, as the $CHF_3$ gas is a deposit gas, a material 56 is deposited on the side surface of the aperture 55, which narrows the width of the aperture 55 (FIG. 3C) (material deposition step, first material deposition step). As the high frequency power of 100 W is supplied to the mounting stage 23, ions or the like are drawn to the wafer W by sputtering, thereby a material is not deposited on the surface of the photoresist film 54 or the bottom of the aperture 55.

As described above, the width of the aperture 55 becomes narrower at a predetermined rate as the aperture 55 is exposed to plasma longer. Therefore, the width of the aperture 55 can be controlled by controlling the time to expose the aperture 55 to the plasma. In this process, a memory medium (not shown) of the substrate processing system 10 stores data of a predetermined time to make the aperture 55 have a width of 30 nm in advance. A computer (not shown) of the substrate processing system 10 reads out the data of the predetermined time from the memory medium. The aperture 55 is exposed to the generated plasma for the predetermined time controlled by the computer of the substrate processing system 10.

Etching by the plasma generated from the CHF3 gas causes roughness on the side surface of the aperture 55. On the other hand, the plasma generated from the HBr gas smoothes the photoresist film 54 and prevents roughness caused on the side surface of the aperture 55.

Next, the wafer W is carried out of the chamber 22 of the process module 12 and transported into a chamber of the process module 13 through the transfer module 11. At this time, the wafer W is mounted on the mounting stage.

Figure 3E:
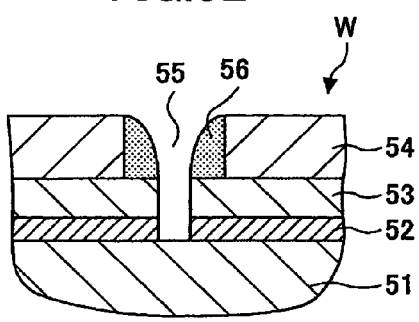
Figure 3F:
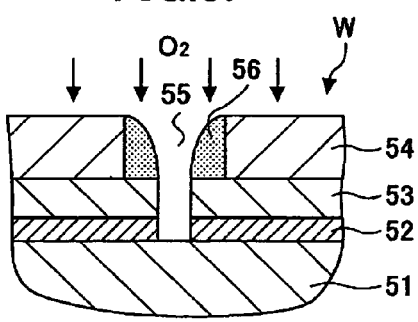

Then, an internal pressure of the chamber is set at 5.3 Pa (40 mTorr) by using an APC valve or the like. A $Cl_2$ gas is supplied from the lower side gas supplier of the shower head into the chamber at a flow rate of 100 sccm and a $N_2$ gas is supplied from the upper side gas supplier into the chamber at a flow rate of 50 sccm. Then, a high frequency power of 150 W is supplied to the mounting stage and a high frequency power of 300 W is supplied to the shower head. At this time, the $Cl_2$ gas and the $N_2$ gas turn to plasma by the high frequency power applied to the process space S, thereby ions and radicals are generated. These ions and radicals collide and react with the TiN film 52 of a portion which is not covered with the photoresist film 54 and the material 56 is deposited on the side surface of the aperture 55 in the photoresist film 54 (FIG. 3D) (etching step, first etching step). The TiN film 52 of this portion is etched until the TEOS film 51 is exposed. As a result, an aperture with a width of 30 nm (second aperture) is formed in the TiN film 52 serving as the process layer (FIG. 3E).

Subsequently, the wafer W is carried out of the chamber in the process module 13 and transported into the chamber of the process module 14 through the transfer module 11. At this time, the wafer W is mounted on the mounting stage.

Figure 3G:
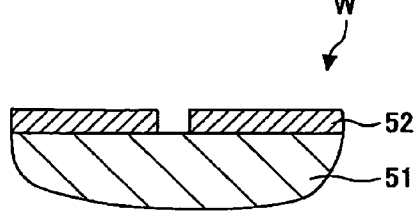

An internal pressure in the chamber is set at $1.3 \times 10$ Pa (100 mTorr) by using the APC valve or the like. An $O_2$ gas is supplied at a flow rate of 400 sccm from the gas supplier of the shower head. A high frequency power of 30 W is supplied to the mounting stage and a high frequency power of 600 W is supplied to the shower head. As a result, the $O_2$ gas turns to plasma, generating ions and radicals. By these ions and radicals, an asking treatment is applied to the reflection preventive film 53 and the photoresist film 54 stacked over the TiN film 52 and the material 56 is deposited on the side surface of the aperture of the photoresist film 54 (FIG. 3F) (ashing step). Consequently, the reflection preventive film 53, the photoresist film 54, and the material 56 deposited on the side surface of the aperture 55 of the photoresist film 54 are removed (FIG. 3G).

Then, the wafer W is carried out of the chamber of the process module 14 and this process ends.

According to the substrate processing method of this embodiment, the reflection preventive film 53 of a portion which is not covered with the photoresist film 54 is etched by the plasma generated from the $CHF_3$ gas, thereby a portion of the TiN film 52 is exposed. After that, the material 56 is deposited on the side surface of the aperture 55 of the photoresist film 54 and then the exposed TiN film 52 is etched. When the material 56 is deposited on the side surface of the aperture 55 of the photoresist film 54, the width of the aperture 55 becomes narrower. Therefore, an aperture with a narrow width can be formed in the TiN film 52 serving as the process layer. For example, by depositing the material 56 on the side surface of the aperture 55 of the photoresist film 54 to control the width of the aperture 55 to be 30 nm, an aperture with a width of 30 nm can be formed in the TiN film 52 serving as the process layer. As a result, an aperture with a size which can satisfy the demand for downsizing the semiconductor devices can be formed in the TiN film 52 serving as the process layer.

Further, according to the substrate processing method of this embodiment, an endpoint of the etching applied to the reflection preventive film 53 is detected. Exposed to the plasma generated from the $CHF_3$ gas, the material 56 starts to be deposited on the side surface of the aperture 55 after the etching of the reflection preventive film 53. Therefore, a start point of the deposition of the material 56 can be detected, which makes it possible to precisely control the width of the aperture 55.

According to the substrate processing method of this embodiment, the ions and radicals in the plasma generated from the $CHF_3$ gas collide and react with the side surface of the aperture 55 in the photoresist film 54 when etching the reflection preventive film 53, causing roughness of the side surface of the aperture 55. However, the plasma generated from the HBr gas smoothes the photoresist film 54, which smoothes the roughness of the side surface of the aperture 55. As a result, the roughness caused on the side surface of the aperture 55 can be smoothed before etching the TiN film 52 using the photoresist film 54 as a mask. Thus, a striation can be prevented from being caused on the side surface of the aperture 55 formed by etching the TiN film 52.

The wafer W to which the substrate processing method of this embodiment is applied has the TiN film 52 serving as the process layer, however, the process layer is not limited to this. A film which is not etched by the plasma generated from the $CHF_3$ gas and the HBr gas, such as a $SiO_2$ film and a SiON film may be used.

Although the $CHF_3$ gas is used as the CF-based deposit gas in the substrate processing method of this embodiment, any CF-based deposit gas which can etch the reflection preventive film 53 can be used, such as a $CH_2F_2$ gas, a $CH_3F$ gas, a $C_5F_8$ gas, and a $C_4F_6$ gas.

In the substrate processing method of this embodiment, after the endpoint of the etching of the reflection preventive film 53 is detected, the aperture 55 is exposed to the plasma for the predetermined time stored in the memory medium in advance, so that the aperture 55 has a width of 30 nm. It is also possible to mount a CD measuring module in the process module 12 to monitor the width (CD value) of the aperture 55 in real time by an optical digital profilometry (ODP) technique while the aperture 55 is exposed to the plasma. As a result, the width of the aperture 55 can be more precisely set at 30 nm.

Another example of the substrate processing method of this embodiment is described.

FIGS. 4A to 4G show process diagrams showing another example of the substrate processing method realized by the substrate processing system shown in FIG. 1.

Figure 4A:
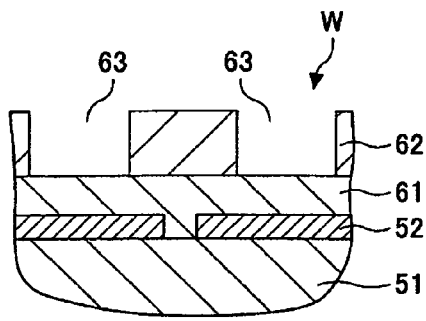
FIGS. 4A to 4G are process drawings showing another example of the substrate processing method realized by the substrate processing system of FIG. 1.

A reflection preventive film 61 (second intermediate layer) and a photoresist film 62 (second mask layer) are stacked (layer stacking step) in this order over the wafer W which underwent the substrate processing method of FIG. 3. The photoresist film 62 has apertures 63 (third apertures) exposing portions of the reflection preventive film 61, which are not formed over an aperture formed in the TiN film 52. Thus, the wafer W is prepared (FIG. 4A). The wafer W is transported into the chamber 22 of the process module 12 and mounted on the mounting stage 23.

Figure 4B:
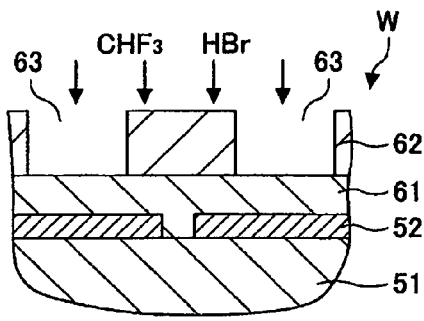
Figure 4C:
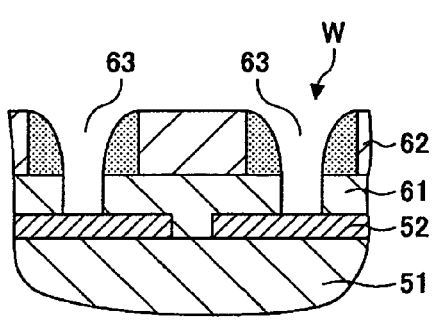
Figure 4D:
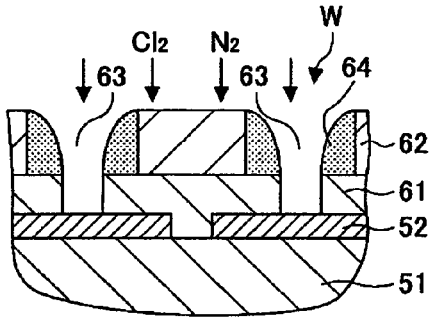

Similarly to the process of FIG. 3, the reflection preventive film 61 of portions which are not covered with the photoresist film 62 are etched in the process module 12 (FIG. 4B). At this time, the material 64 is deposited on the side surface of the apertures 63, which narrows the widths (CD values) of the apertures 63 (FIG. 4C) (second material deposition step) similarly to the process of FIG. 3.

The wafer W is carried out of the chamber 22 of the process module 12 and transported into the chamber of the process module 13 through the transfer module 11. At this time, the wafer W is mounted on the mounting stage.

Figure 4E:
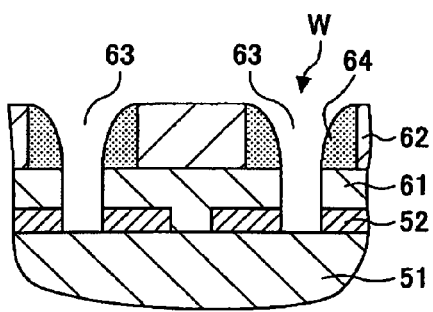

Similarly to the process of FIG. 3, the TiN film 52 of portions which are not covered with the photoresist film 62 and the material 56 deposited on the side surface of the apertures 63 of the photoresist film 62 are etched (FIG. 4D) (second etching step). The TiN film 52 of these portions is etched until the TEOS film 51 is exposed. As a result, apertures with a width of 30 nm are additionally formed in the TiN film 52 serving as the process layer. Consequently, the apertures are formed in the TiN film 52 in addition to the aperture formed by the substrate processing method of FIG. 3. The apertures with a narrower pitch are formed in the TiN film (FIG. 4E).

The wafer W is carried out of the chamber of the process module 13 and transported into the chamber of the process module 14 through the transfer module 11. At this time, the wafer W is mounted on the mounting stage.

Figure 4F:
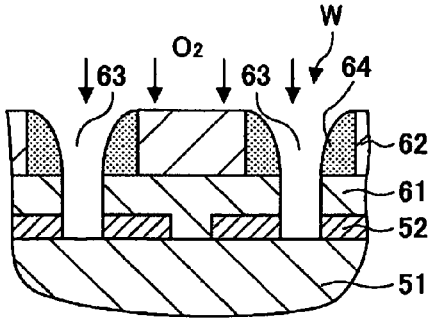
Figure 4G:
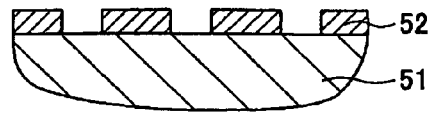
Figure 5:
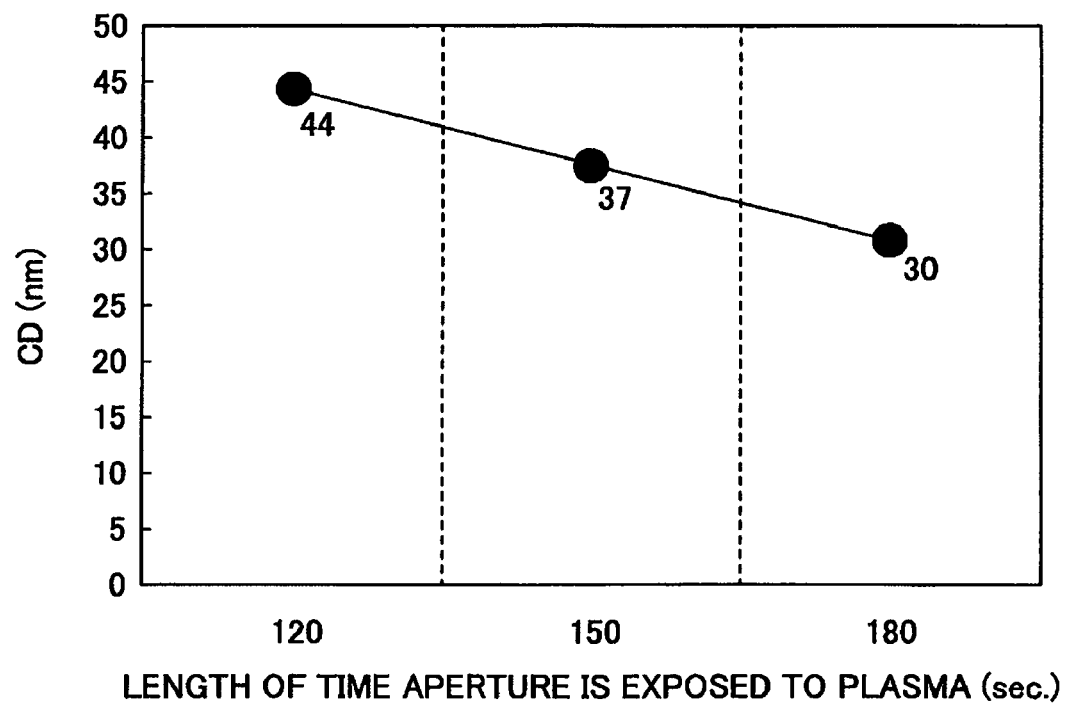
FIG. 5 is a graph showing a relationship between a length of time that an aperture is exposed to plasma and a width of the aperture.

Similarly to the process of FIG. 3, an asking treatment is applied to the reflection preventive film 61, and the photoresist film 62 which are stacked over the wafer W, and the material 64 deposited on the side surface of the aperture 63 of the photoresist film 62 (FIG. 4F). As a result, the reflection preventive film 61, the photoresist film 62, and the material 64 deposited on the side surface of the aperture 63 of the photoresist film 62 are removed (FIG. 4G).

The wafer W is carried out of the chamber of the process module 14 and this process ends.

According to this example, the reflection preventive film 61 of portions which are not covered with the photoresist film 62 and which are not over the aperture formed in the TiN film 52 is etched by the plasma generated from the $CHF_3$ gas, thereby the portions of the TiN film 52 are exposed. Then, the material 64 is deposited on the side surface of the aperture 63 of the photoresist film 62 and the exposed TiN film 52 is etched. When the material 64 is deposited on the side surface of the aperture 63 of the photoresist film 62, a width of the aperture 63 becomes narrower. Therefore, apertures with a narrow width can be formed in the TiN film 52 serving as the process layer in addition to the aperture formed by the substrate processing method of FIG. 3 and the pitch between the apertures can be narrowed. For example, by depositing the material 64 on the side surface of the aperture 63 of the photoresist film 62 to make the aperture 63 have a width of 30 nm, an aperture with a width of 30 nm can be additionally formed in the TiN film 52 serving as the process layer. As a result, an aperture with a size satisfying the demand for downsizing the semiconductor devices can be formed in the TiN film 52, which results in narrowing the pitch between the apertures.

A description is made on a substrate processing method of a second embodiment of this invention.

FIGS. 6A to 6I are process diagrams showing the substrate processing method of this embodiment. The substrate processing method of this embodiment is performed by a substrate processing system having a similar structure to the substrate processing system 10 of FIG. 1. In the substrate processing method of this embodiment, a silicon substrate 65 (process layer) such as a thermally oxidized silicon film 66 (intermediate layer) with a thickness of, for example, 100 nm, a reflection preventive film (BARC film) 67, and a photoresist film 68 (mask film) formed of KrF are stacked in this order as a wafer W. An aperture (hole or trench) with a width of about 30 nm is formed in the silicon substrate 65. In the wafer W, the photoresist film 68 is formed in a predetermined pattern, partially exposing the reflection preventive film 67. A width of the photoresist film 68 (length of horizontal direction in the drawing) is, for example, 130 nm.

In FIG. 6, the wafer W is prepared (FIG. 6A) first. A process gas such as a mixed gas including at least one of a $CH_2F_2$ gas, a $CHF_3$ gas, a $CH_3F$ gas, a $CF_4$ gas, a $N_2$ gas, or an $O_2$ gas is used to generate plasma in a process module to perform a plasma etching treatment. The reflection preventive film 67 and the thermally oxidized silicon film 66 which are not covered with the photoresist film 68 are etched by ions and radicals in the plasma (intermediate layer anisotropic etching step). At this time, since a bias voltage is applied to a mounting stage on which the wafer W is mounted, the ions and the like are drawn to the wafer W. The etching applied to the reflection preventive film 67 and the thermally oxidized silicon film 66 proceeds in a direction of their thickness (vertical direction in the drawing), which is anisotropic etching. As a result, the silicon substrate 65 is partially exposed and the side surfaces of the reflection preventive film 67 and the thermally oxidized silicon film 66 are exposed (FIG. 6B). At this time, although the photoresist film 68 is also slightly etched, a length of time to apply the anisotropic etching is controlled so that at least a predetermined thickness of the photoresist film 68 is left.

In a process module which performs a COR (Chemical Oxide Removal) treatment, a COR treatment is applied to the wafer W (intermediate layer isotropic etching step). The COR treatment is a treatment to generate a product by a chemical reaction between silicon oxide and a process gas (hydrogen fluoride or ammonia) and vaporize and sublime the product. To be specific, the COR treatment can be expressed by the following chemical reaction formula.

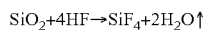

Figure 6A:
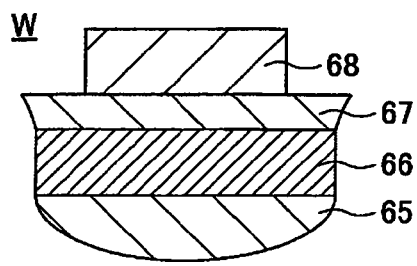
FIGS. 6A to 6I are process drawings showing a substrate processing method of a second embodiment of the invention.
Figure 6B:
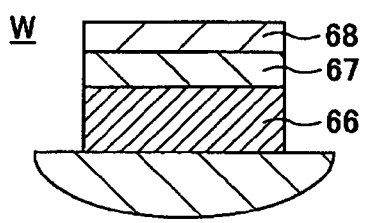
Figure 6C:
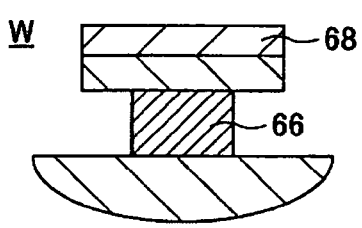

The COR treatment is a treatment using a chemical reaction. As the chemical reaction proceeds in an isotropic manner, the thermally oxidized silicon film 66 is etched certainly in the isotropic manner. However, since the predetermined thickness of the photoresist film 68 is left as described above, the photoresist film 68 covering the thermally oxidized silicon film 66 prevents the thermally oxidized silicon film 66 from being etched in the direction of the thickness. Therefore, since only the side surface of the thermally oxidized silicon film 66 is etched, only the width of the thermally oxidized silicon film 66 can be certainly reduced (FIG. 6C). At this time, the thermally oxidized silicon film 66 is formed to have a width of, for example, 30 nm by controlling a length of time to apply the COR treatment.

Figure 6D:
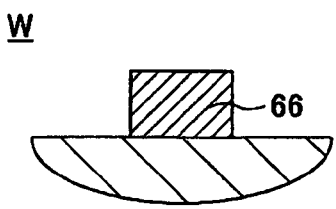
Figure 6E:
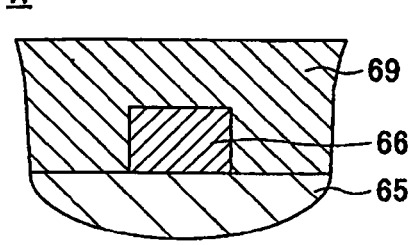

In a process module to perform an asking treatment, a process gas such as an $O_2$ gas is used to generate plasma. By ions and radicals in the plasma, the photoresist film 68 and the reflection preventive film 67 are removed to expose the thermally oxidized silicon film 66 with a narrower width (mask layer removing step) (FIG. 6D).

Figure 6F:
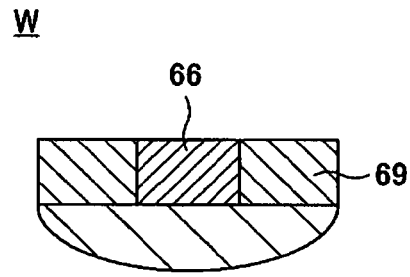

In a coating module such as a spin coater, an organic-based film 69 such as a SiLK (registered trademark) film and a film formed of polyimide is formed to cover the silicon substrate 65 and the thermally oxidized silicon film 66 with a narrower width (FIG. 6E) (covering layer forming step). Further, in a process module to perform an ashing treatment, a process gas such as a mixed gas of an $O_2$ gas, an Ar gas, and an $N_2$ gas is used to generate plasma for removing the organic-based film 69 (covering layer removing step). At this time, by controlling a length of time to apply the ashing treatment, a predetermined amount of the organic-based film 69 is removed so that only the thermally oxidized silicon film 66 with a narrowed width is exposed (FIG. 6F).

Figure 6G:
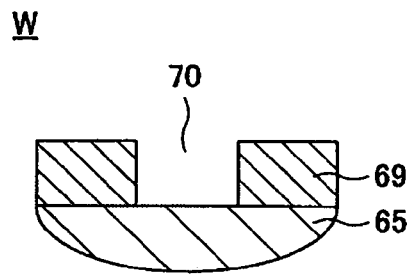

Subsequently, a COR treatment is applied to the wafer in a process module to apply a COR treatment (intermediate layer removing step). At this time, since only the thermally oxidized silicon film 66 chemically reacts with hydrogen fluoride and ammonia, only the thermally oxidized silicon film 66 is selectively removed. As a result, an aperture 70 partially exposing the silicon substrate 65 is formed in the organic-based film 69 (FIG. 6G). A width of the aperture 70 corresponds to a width of the thermally oxidized silicon film 66, which is for example, 30 nm.

Figure 6H:
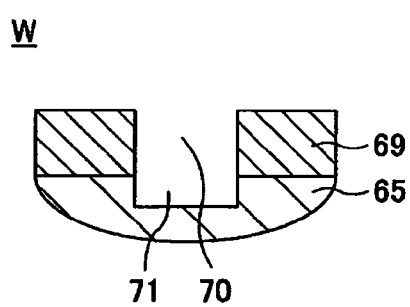

Next, a process gas such as a mixed gas of a $Cl_2$ gas and a $N_2$ gas or a mixed gas of a HBr gas and a $N_2$ gas is used to generate plasma. By ions and radicals in the plasma, the silicon substrate 65 is etched through the aperture 70 (process layer etching step). At this time, since a bias voltage is applied to a mounting stage on which the wafer W is mounted, ions and the like are drawn to the wafer W. Therefore, etching applied to the silicon substrata 65 proceeds in a direction of the thickness, which is an anisotropic etching. As a result, an aperture 71 with a narrow width is formed in the silicon substrate 65 (FIG. 6H).

Figure 6I:
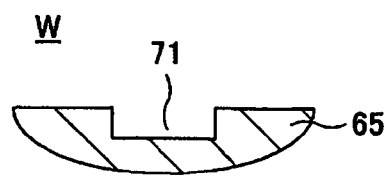

Then, by using a process gas such as an $O_2$ gas to generate plasma in a process module to perform an asking treatment, the organic-based film 69 is removed by ions and radicals in the plasma (FIG. 6I). After this, this process ends.

According to the substrate processing method of this embodiment, a COR treatment is applied to the side surface of the thermally oxidized silicon film 66, which is exposed by the anisotropic etching using plasma. As a result, a width of the thermally oxidized silicon film 66 is reduced. A predetermined amount of the organic-based film 69 covering the silicon substrate 65 and the thermally oxidized silicon film 66 with the narrowed width is removed, thereby only the thermally oxidized silicon film 66 with the narrowed width is exposed. Further, the thermally oxidized silicon film 66 with the narrowed width is selectively removed, thereby the aperture with a narrow width which partially exposes the silicon substrate 65 is formed in the organic-based film 69. Anisotropic etching using plasma is applied to the silicon substrate 65 through the aperture 70. Therefore, the aperture 71 with a narrow width can be formed in the silicon substrate 65. As a consequence, the aperture 71 with a size satisfying the demand for downsizing the semiconductor devices can be formed in the silicon substrate 65.

Although the aperture 71 with a narrow width is formed in the silicon substrate 65 by the substrate processing method of FIG. 6, the process layer having the aperture 71 is not limited to the silicon substrate 65. Any film having a high selection ratio with the organic-based film 69 in the anisotropic etching may be used. Moreover, a layer of which width is reduced by the COR treatment as the isotropic etching is not limited to the thermally oxidized silicon film 66. Any layer including silicon oxide and a component comparable to silicon oxide may be used, such as a TEOS film. Further, a mask film covering the reflection preventive film 67 is not limited to the photoresist film 68, but a hard mask film may also be used.

A description is now made on a substrate processing method of a third embodiment of this invention.

FIGS. 7A to 7F and 8A to 8F are process diagrams showing a substrate processing method of this embodiment. The substrate processing method of this embodiment is also performed by a substrate processing system having a similar structure to the substrate processing system 10 shown in FIG. 1. In the substrate processing method of this embodiment, a first polysilicon layer 72, a first TEOS film 73, a second polysilicon layer 74 (process layer), a first silicon nitride film 75 (first intermediate layer), a second TEOS film 76 (second intermediate layer), a second silicon nitride film 77 (second intermediate layer), a reflection preventive film (BARC film) 78 (third intermediate layer), and a photoresist film 79 (mask film) are stacked in this order as a wafer W. Plural apertures (holes or trenches) with a width of about 30 nm are formed in the second polysilicon layer 74 with a narrow pitch between the apertures. In the wafer W, the photoresist film 79 has an aperture 80 partially exposing the reflection preventive film 78. A width (length of horizontal direction in the drawing) of the photoresist film 79 is, for example, 60 nm. A width of the aperture 80 of the photoresist film 79 is, for example, also 60 nm.

Figure 7A:
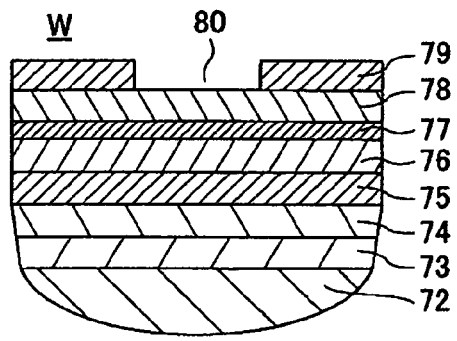
FIGS. 7A to 7F are process drawings showing a substrate processing method of a third embodiment of the invention.

In FIGS. 7 and 8, the wafer W is prepared first (FIG. 7A). A process gas such as a mixed gas including a $CHF_3$ gas and an HBr gas is used to generate plasma in a process module to perform a plasma etching treatment. By ions and radicals in the plasma, the reflection preventive film 78 which is not covered with the photoresist film 79 is etched, thereby an aperture 82 to partially expose the second silicon nitride film 77 is formed. At this time, as the $CHF_3$ gas is a deposit gas, a material 81 is deposited on the side surface of the aperture 82 when the plasma etching treatment is continued after forming the aperture 82, which narrows the width of the aperture 82 (FIG. 7B) (material deposition step). At this time, a length of time to apply the plasma etching treatment is controlled so that the width of the aperture 82 becomes, for example, 30 nm by the deposited material 81.

Figure 7B:
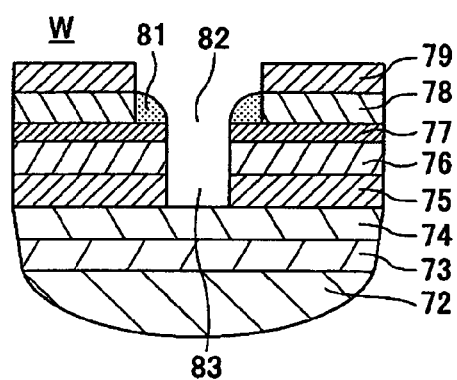

In the process module to perform a plasma etching treatment, a process gas such as a mixed gas including at least one of a $CH_2F_2$ gas, a $CHF_3$ gas, a $CH_3F$ gas, a $CF_4$ gas, a $N_2$ gas, and an $O_2$ gas is used to generate plasma. By ions and radicals in the plasma, the second silicon nitride film 77 exposed through the aperture 82, the second TEOS film 76, and the first silicon nitride film 75 are etched (intermediate layer anisotropic etching step). At this time, since a bias voltage is applied to a mounting stage on which the wafer W is mounted, ions and the like are drawn to the wafer W. Therefore, etching applied to the second silicon nitride film 77, the second TEOS film 76, and the first silicon nitride film 75 proceeds in a direction of the thickness (vertical direction in the drawing), which is an anisotropic etching. As a result, an aperture 83 partially exposing the second polysilicon layer 74 is formed in the first silicon nitride film 75. At the same time, side surfaces of the second silicon nitride film 77, the second TEOS film 76, and the first silicon nitride film 75 are exposed (FIG. 7B). A width of the aperture 83 corresponds to the width of the aperture 82, which is for example, 30 nm.

Figure 7C:
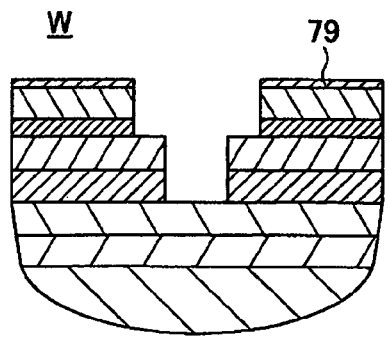

In a process module to perform an ashing treatment, a process gas such as an $O_2$ gas is used to generate plasma. By ions and radicals in the plasma, the material 81 is removed and the photoresist film 79 is etched (FIG. 7C). At this time, a length of time to apply the ashing treatment is controlled so that the resist film 79 is left with at least a predetermined thickness.

Figure 7D:
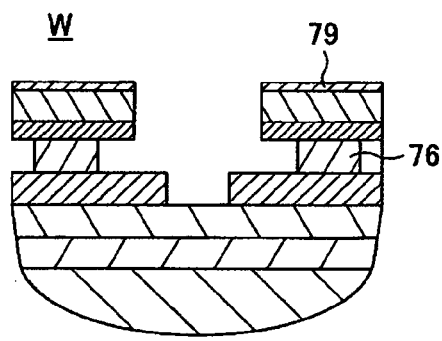
Figure 7E:
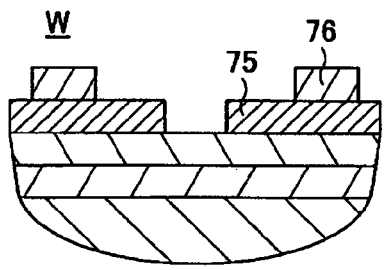
Figure 7F:
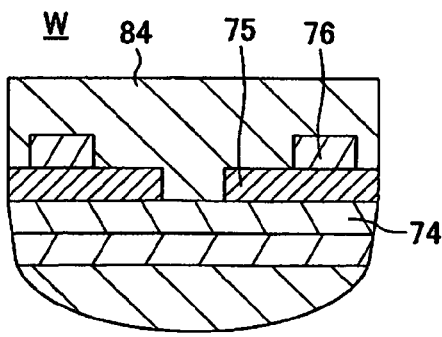

In a process module to perform a COR treatment, a COR treatment is applied to the wafer W (intermediate layer isotropic etching step). By the COR treatment, the second TEOS film 76 is certainly etched in an isotropic manner. However, the photoresist film 79 left with the predetermined thickness covering the second TEOS film 76 prevents the second TEOS film 76 from being etched in the direction of the thickness. Therefore, only a side surface of the second TEOS film 76 is etched by the COR treatment. As a result, only the width of the second TEOS film 76 can be certainly reduced (FIG. 7D). At this time, by controlling the length of time to apply the COR treatment, the width of the second TEOS film 76 can be, for example, 30 nm.

Next, a process gas such as an $O_2$ gas is used to generate plasma in a process module to perform an asking treatment. By ions and radicals in the plasma, the photoresist film 79, the reflection preventive film 78, and the second silicon nitride film 77 are removed, thereby the second TEOS film 76 with a narrowed width is exposed (FIG. 7E) (third intermediate layer removing step). At this time, the first silicon nitride film 75 is also partially exposed.

Figure 8A:
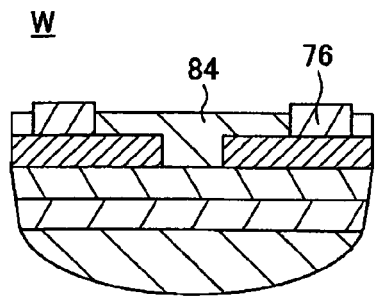
FIGS. 8A to 8F are process drawings showing the substrate processing method of the third embodiment of the invention.

Subsequently, in a coating module such as a spin coater, an organic-based film 84 (covering layer) such as a SiLK (registered trademark) film or a film formed of polyimide is formed to cover the second polysilicon layer 74, the first silicon nitride film 75, and the second TEOS film 76 with a narrowed width (FIG. 7F) (covering layer forming step). Further, in a process module to perform an ashing treatment, a process gas such as a mixed gas of an $O_2$ gas, an Ar gas, and an $N_2$ gas is used to generate plasma, thereby the organic-based film 84 is removed (covering layer removing step). At this time, by controlling a length of time to apply the ashing treatment, the organic-based film 84 is removed by a predetermined amount so that only the second TEOS film 76 is exposed (FIG. 8A).

Figure 8B:
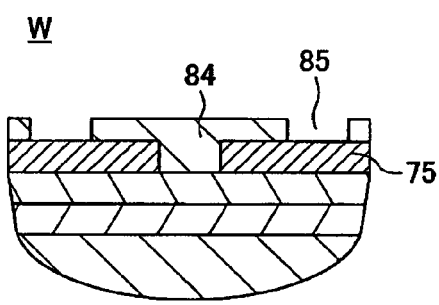

In a process module to perform a COR treatment, a COR treatment is applied to the wafer W (second intermediate layer removing step). At this time, since only the second TEOS film 76 chemically reacts with hydrogen fluoride and ammonia, only the second TEOS film 76 is selectively removed. As a result, apertures 85 to partially expose the first silicon nitride film 75 are formed in the organic film 84 (FIG. 8B). A width of the aperture 85 corresponds to the width of the second TEOS film 76, which is for example, 30 nm.

Figure 8C:
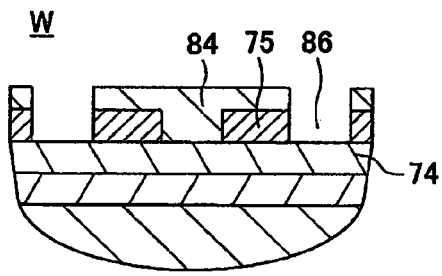

In a process module to perform a plasma etching treatment, a process gas such as a mixed gas including at least one of a $CH_2F_2$ gas, a $CHF_3$ gas, a $CH_3F$ gas, a $CF_4$ gas, an $N_2$ gas, and an $O_2$ gas is used to generate plasma. By ions and radicals in the plasma, the first silicon nitride film 75 exposed through the aperture 85 is etched (first intermediate layer removing step). At this time, since a bias voltage is applied to a mounting stage on which the wafer W is mounted, ions and the like are drawn to the wafer W. Therefore, etching applied to the first silicon nitride film 75 proceeds in a direction of the thickness, which is an anisotropic etching. As a result, apertures 86 with a narrow width are formed in the second polysilicon layer 74 (FIG. 8C). A width of the aperture 86 corresponds to the width of the aperture 85, which is for example, 30 nm.

Figure 8D:
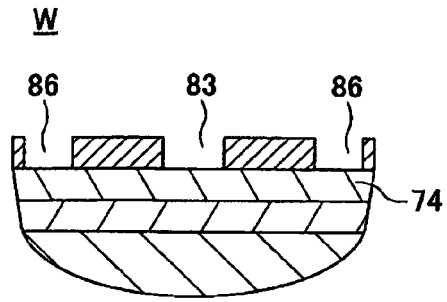

Subsequently, a process gas such as an $O_2$ gas is used to generate plasma in a process module to perform an asking treatment. By ions and radicals in the plasma, the organic-based film 84 is completely removed (covering layer complete removing step), thereby the second polysilicon layer 74 covered with the organic-based film 84 is exposed through the aperture 83 (FIG. 8D).

Figure 8E:
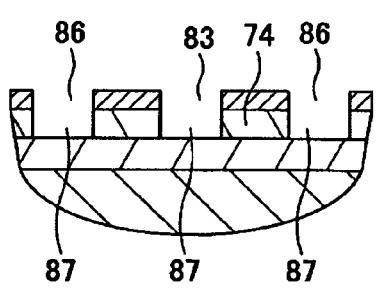
Figure 8F:
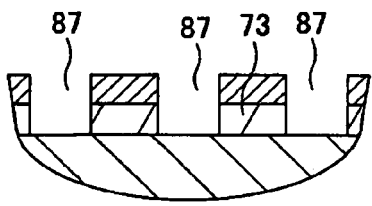

In a process module to perform a plasma etching treatment, a process gas such as a mixed gas of a $Cl_2$ gas and a $N_2$ gas or a mixed gas of a HBr gas and a $N_2$ gas is used to generate plasma. By ions and radicals in the plasma, the second polysilicon layer 74 is etched through the apertures 83 and 86 (process layer etching step). At this time, since a bias voltage is applied to a mounting stage on which the wafer W is mounted, ions and the like are drawn to the wafer W. Therefore, etching applied to the second polysilicon layer 74 proceeds in a direction of the thickness, which is an anisotropic etching. As a result, apertures 87 with a narrow width are formed in the second polysilicon layer 74 (FIG. 8E). After that, the first TEOS film 73 is etched (FIG. 8F) through the apertures 87 and this process ends.

According to the substrate processing method of this embodiment, anisotropic etching using plasma is applied to the first silicon nitride film 75 through the aperture 82 with a width narrowed by a material deposited on the side surface, thereby the aperture 83 with a narrow width is formed in the first silicon nitride film 75. A COR treatment is applied to the side surface of the second TEOS film 76 of which side surface is exposed by the anisotropic etching using plasma, thereby the width of the second TEOS film 76 is reduced. By removing the organic-based film 84 covering the second polysilicon layer 74, the first silicon nitride film 75, and the second TEOS film 76 with a narrowed width for a predetermined amount, only the second TEOS film 76 with a narrowed width is exposed. Further, by selectively removing the second TEOS film 76 with a narrowed width, the aperture 85 with a narrow width to partially expose the first silicon nitride film 75 is formed in the organic-based film 84. Anisotropic etching is applied to the first silicon nitride film 75 through the aperture 85 of the organic-based film 84, thereby the aperture 86 with a narrow width is formed in the first silicon nitride film 75. Then, anisotropic etching is applied to the second polysilicon layer 74 through the apertures 83 and 86. As a result, the apertures 87 with a narrow width can be formed in the second polysilicon layer 74. Consequently, the apertures 87 with a size satisfying the demand for downsizing the semiconductor devices can be formed in the second polysilicon layer 74.

A position of the aperture 83 corresponds to a position of the aperture 82 and a position of the aperture 86 corresponds to a position of the second TEOS film 76 of which width is narrowed. Thus, the apertures 83 and 86 do not contact with each other. As a result, a pitch between the apertures 87 in the second polysilicon layer 74 can be narrowed.

In the aforementioned substrate processing method of this embodiment, the photoresist film 79 is left with the predetermined thickness when the COR treatment to the side surface of the second TEOS film 76 starts. However, the photoresist film 79 may be completely removed as long as the reflection preventive film 78 is left with the predetermined thickness.

In the aforementioned substrate processing method of this embodiment, the first TEOS film 73 is formed under the second polysilicon layer 74. However, a gate oxide film may be formed under the second polysilicon layer 74. In this case, the process ends after the apertures 87 are formed in the second polysilicon layer 74.

Next, a description is made on a substrate processing method of a fourth embodiment of the invention.

FIGS. 9A to 9F and 10A to 10F are process diagrams showing the substrate processing method of this embodiment. The substrate processing method of this embodiment is also performed by a substrate processing system having a similar structure to the substrate processing system 10 shown in FIG. 1. In the substrate processing method of this embodiment, a silicon substrate 88 (process layer), a silicon nitride film 89 (first intermediate layer), a TEOS film 90 (second intermediate layer), a carbon film 91 (third intermediate layer), a reflection preventive film (SiARC film) 92 (third intermediate layer), and a photoresist film 93 (mask film) are stacked in this order as a wafer W. Plural apertures (holes or trenches) with a width of about 30 nm are formed in the silicon substrate 88 with a narrowed pitch between the apertures. On the wafer W, the photoresist film 93 has an aperture 94 which partially exposes the reflection preventive film 92. A width (length of horizontal direction in the drawing) of the photoresist film 93 is, for example, 60 nm. A width of the aperture 94 in the photoresist film 93 is, for example, also 60 nm.

Figure 9A:
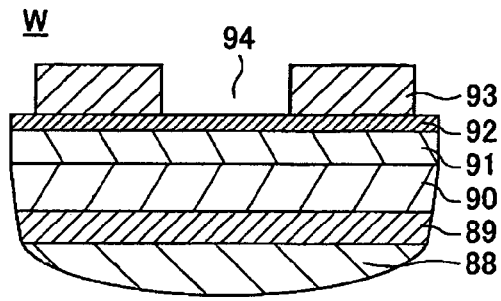
FIGS. 9A to 9F are process drawings showing a substrate processing method of a fourth embodiment of the invention.
Figure 9B:
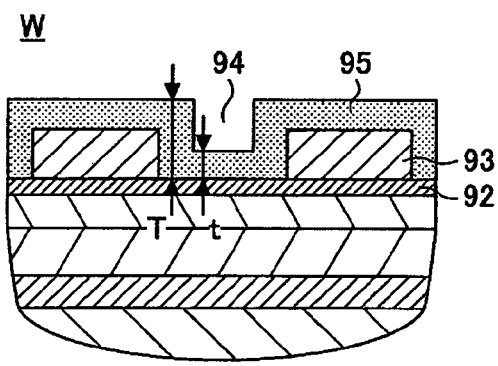

In FIGS. 9 and 10, the wafer W is prepared first (FIG. 9A). In a process module to perform a film forming treatment, an MLD (Molecular Layer Deposition) oxide film 95 is formed to cover the photoresist film 93 and the exposed reflection preventive film 92 (first covering layer forming step). Since the MLD oxide film 95 grows in an isotropic manner, the MLD oxide film 95 is formed over a surface of the aperture 94 in addition to top surfaces of the reflection preventive film 92 and the photoresist film 93 (FIG. 9B). At this time, a length of time to apply the film forming treatment is controlled so that a deposition thickness of the MLD oxide film 95 becomes, for example, 15 nm.

Figure 9C:
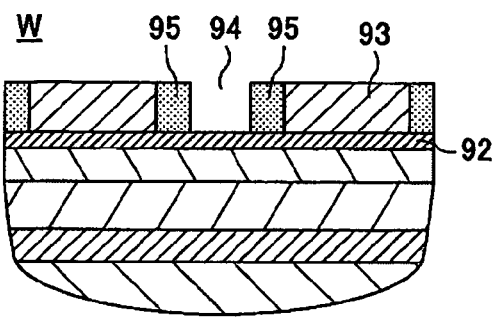

In a process module to perform an asking treatment, a process gas such as an $O_2$ gas is used to generate plasma. By ions and radicals in the plasma, the MLD oxide film 95 is etched (first covering layer etching step) (FIG. 9C). At this time, since a bias voltage is applied to a mounting stage on which the wafer W is mounted, the ions and the like are drawn to the wafer W. Therefore, etching applied to the MLD oxide film 95 proceeds in a vertical direction in the drawing, which is an anisotropic etching. The etching applied to the MLD oxide film 95 stops when the reflection preventive film 92 is exposed at a bottom of the aperture 94. A thickness T (see FIG. 9B) of the MLD oxide film 95 formed on the side surface of the aperture 94 is thicker than a thickness t (see FIG. 9B) of the MLD oxide film 95 formed at the bottom of the aperture 94. Therefore, the MLD oxide film 95 is left on the side surface of the aperture 94 when the reflection preventive film 92 is exposed at the bottom of the aperture 94 by etching the MLD oxide film 95. Consequently, a width of the aperture 94 becomes narrower as shown in FIG. 9C. A deposition thickness of the MLD oxide film 95 is, for example, 15 nm, which makes the width of the aperture 94, for example, 30 nm.

Figure 9D:
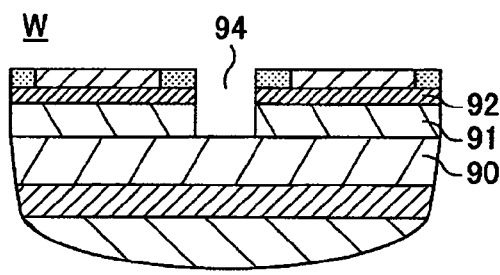

In a process module to perform a plasma etching treatment, a process gas such as a mixed gas including at least one of a $CH_2F_2$ gas, a $CHF_3$ gas, a $CH_3F$ gas, a $CF_4$ gas, a $N_2$ gas, and an $O_2$ gas is used to generate plasma. By ions and radicals in the plasma, the reflection preventive film 92 exposed through the aperture 94 is etched to expose the carbon film 91. Then, a mixed gas of a HBr gas and a $CO_2$ gas or a mixed gas of an $O_2$ gas and a $CH_4$ gas (or a CO gas) is used to generate plasma. By ions and radicals in the plasma, the carbon film 91 exposed through the aperture 94 is etched to expose the TEOS film 90 (intermediate layer anisotropic etching step) (FIG. 9D).

In a process module to perform a plasma etching treatment, a process gas such as a mixed gas including at least one of a $CH_2F_2$ gas, a $CHF_3$ gas, a $CH_3F$ gas, a $CF_4$ gas, a $N_2$ gas, and an $O_2$ gas is used to generate plasma. By ions and radicals in the plasma, the exposed TEOS film 90 and the silicon nitride film 89 are etched through the aperture 94.

Figure 9E:
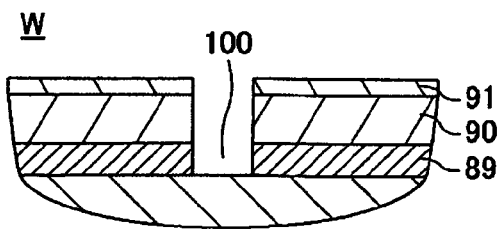

At this time, since a bias voltage is applied to a mounting stage on which the wafer W is mounted, ions and the like are drawn to the wafer W. Therefore, etching applied to the reflection preventive film 92, the carbon film 91, the TEOS film 90, and the silicon nitride film 89 proceeds in a direction of the thickness (vertical direction in the drawing), which is an anisotropic etching. As a result, an aperture 100 to partially expose the silicon substrate 88 is formed in the silicon nitride film 89 and the side surfaces of the carbon film 91, the TEOS film 90, and the silicon nitride film 89 are exposed (FIG. 9E). A width of the aperture 100 corresponds to the width of the aperture 94, which is for example, 30 nm.

At this time, the photoresist film 93 and the MLD oxide film 95 are removed by etching the reflection preventive film 92, the carbon film 91, the TEOS film 90, and the silicon nitride film 89. The carbon film 91 covered with the photoresist film 93 and the MLD oxide film 95 is also exposed and etched, however, a length of time to apply the plasma etching treatment is controlled so that the carbon film 91 is left with at least a predetermined thickness over the TEOS film 90.

Figure 9F:
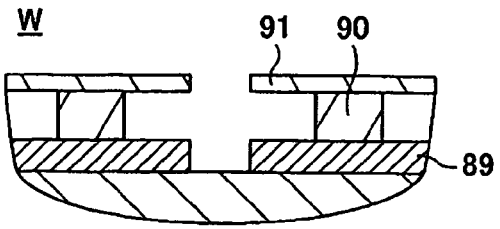

In a process module to perform a COR treatment, a COR treatment is applied to the wafer W (intermediate layer isotropic etching step). By the COR treatment, the TEOS film 90 is certainly etched in an isotropic manner. Since the carbon film 91 is left with the predetermined thickness as described above, the carbon film 91 covering the TEOS film 90 prevents the TEOS film 90 from being etched in a direction of the thickness. Therefore, only the side surface of the TEOS film 90 is etched by the COR treatment, thereby only the width of the TEOS film 90 can be certainly narrowed (FIG. 9F). At this time, a length of time to apply the COR treatment is controlled so that the width of the TEOS film 90 becomes, for example, 30 nm.

In a process module to perform an ashing treatment, a process gas such as an $O_2$ gas is used to generate plasma. By ions and radicals in the plasma, the carbon film 91 is removed to expose the TEOS film 90 with a narrowed width (third intermediate layer removing step). At this time, the silicon nitride film 89 is also partially exposed.

Figure 10A:
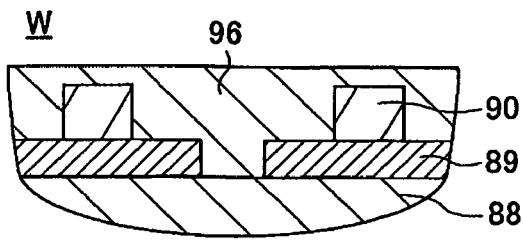
FIGS. 10A to 10F are process drawings showing the substrate processing method of the fourth embodiment of the invention.
Figure 10B:
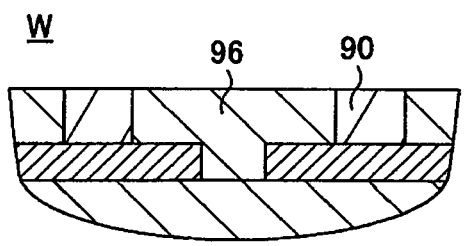

In a coating module such as a spin coater, an organic-based film 96 (second covering layer) such as a SiLK (registered trademark) film or a film formed of polyimide is formed to cover the silicon substrate 88, the silicon nitride film 89, and the TEOS film 90 with the narrowed width (FIG. 10A) (second covering layer forming step). Moreover, a process gas such as a mixed gas of an $O_2$ gas, an Ar gas, and a $N_2$ gas is used to generate plasma in a process module to perform an ashing treatment, thereby the organic-based film 96 is removed (second covering layer removing step). At this time, the organic-based film 96 is removed by a predetermined amount so that only the TEOS film 90 with the narrowed width is exposed by controlling a length of time to apply the ashing treatment (FIG. 10B).

Figure 10C:
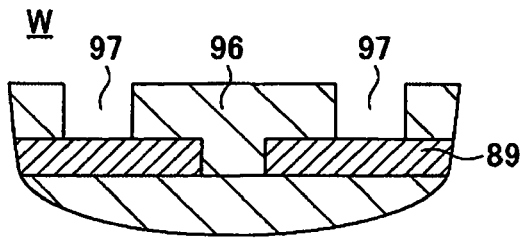

In a process module to perform a COR treatment, a COR treatment is applied to the wafer W (second intermediate layer removing step). At this time, since only the TEOS film 90 chemically reacts with hydrogen fluoride and ammonia, only the TEOS film 90 is selectively removed. As a result, apertures 97 to partially expose the silicon nitride film 89 are formed in the organic-based film 96 (FIG. 10C). A width of the aperture 97 corresponds to the width of the removed TEOS film 90, which is for example, 30 nm.

Figure 10D:
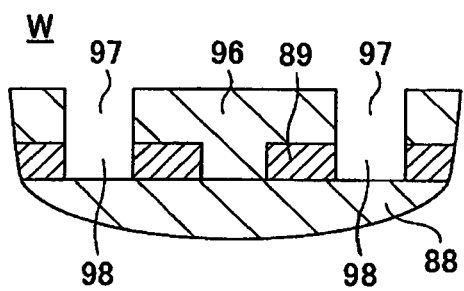

In a process module to perform a plasma etching treatment, a process gas such as a mixed gas including at least one of a $CH_2F_2$ gas, a $CHF_3$ gas, a $CH_3F$ gas, a $CF_4$ gas, a $N_2$ gas, and an $O_2$ gas is used to generate plasma. By ions and radicals in the plasma, the silicon nitride film 89 exposed through the aperture 97 is etched (first intermediate layer removing step). At this time, since a bias voltage is applied to a mounting stage on which the wafer W is mounted, ions and the like are drawn to the wafer W. Therefore, etching applied to the silicon nitride film 89 proceeds in a direction of the thickness, which is an anisotropic etching. As a result, apertures 98 to partially expose the silicon substrate 88 are formed in the silicon nitride film 89 (FIG. 10D). A width of the aperture 98 corresponds to the width of the aperture 97, which is for example, 30 nm.

Figure 10E:
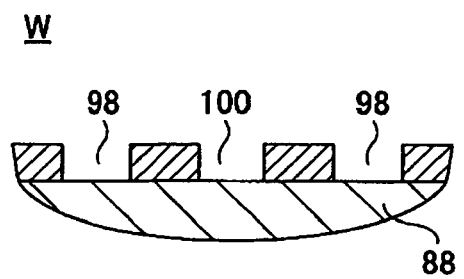

In a process module to perform an asking treatment, a process gas such as an $O_2$ gas is used to generate plasma. By ions and radicals in the plasma, the organic-based film 96 is completely removed (second covering layer complete removing step) to expose the silicon substrate 88 through the aperture 100 (FIG. 10E).

Figure 10F:
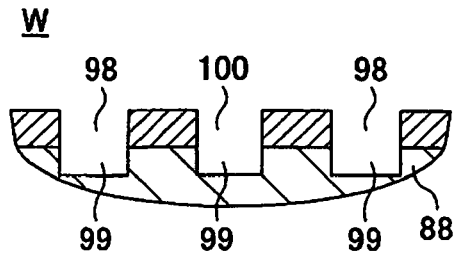

In a process module to perform a plasma etching treatment, a process gas such as a mixed gas of a $Cl_2$ gas and a $N_2$ gas or a mixed gas of a HBr gas and a $N_2$ gas is used to generate plasma. By ions and radicals in the plasma, the silicon substrate 88 is etched through the apertures 100 and 98 (process layer etching step). At this time, since a bias voltage is applied to a mounting stage on which the wafer W is mounted, ions and the like are drawn to the wafer W. Therefore, etching applied to the silicon substrate 88 proceeds in a direction of the thickness, which is an anisotropic etching. As a result, apertures 99 with a narrow width are formed in the silicon substrate 88 (FIG. 10F). After this, this process ends.

According to the substrate processing method of this embodiment, anisotropic etching using plasma is applied to the silicon nitride film 89 through the aperture 94 with a width narrowed by the MLD oxide film 95 left on the side surface, thereby the aperture 100 with a narrow width is formed in the silicon nitride film 89. A COR treatment is applied to the side surface of the TEOS film 90, which is exposed by the anisotropic etching using plasma, thereby a width of the TEOS film 90 is narrowed. By removing a predetermined amount of the organic-based film 96 covering the silicon nitride film 89 and the TEOS film 90 with a narrowed width, only the TEOS film 90 with the narrowed width is exposed. By selectively removing the TEOS film 90 with the narrowed width, apertures 97 with a narrow width to partially expose the silicon nitride film 89 are formed in the organic-based film 96. Anisotropic etching is applied to the silicon nitride film 89 through the apertures 97, thereby apertures 98 with a narrow width are formed in the silicon nitride film 89. Then, anisotropic etching is applied to the silicon substrate 88 through the apertures 100 and 98. As a result, apertures 99 with a narrow width can be formed in the silicon substrate 88. Consequently, the apertures 99 with a size satisfying the demand for downsizing the semiconductor devices can be formed in the silicon substrate 88.

A position of the aperture 100 corresponds to a position of the aperture 94 in the photoresist film 93 and positions of the apertures 98 correspond to the TEOS film 90 with the narrowed width. Therefore, the apertures 100 and 98 do not contact with each other. As a result, a pitch between the apertures 99 in the silicon substrate 88 can be narrowed.

In the substrate processing method of this embodiment, only the carbon film 91 is left with a predetermined thickness over the TEOS film 90 when the COR treatment to the side surface of the TEOS film 90 starts. However, the reflection preventive film 92 or the photoresist film 93 may be left for a predetermined thicknesses over the TEOS film 90 when the COR treatment to the side surface of the TEOS film 90 starts.

In the aforementioned embodiments, a substrate to which the plasma treatment is applied is not limited to a wafer for a semiconductor device. Various substrates used for an LCD (Liquid Crystal Display), an FPD (Flat Panel Display) and the like, a photo mask, a CD substrate, a print substrate, and the like can be used as well.

To achieve an object of at least one embodiment of the invention, a memory medium storing a program code of software to realize the functions of the aforementioned embodiments may be supplied to a system or a device, and a computer (or a CPU, an MPU, or the like) of the system or the device may read out and execute the program code stored in the memory medium.

In this case, the program code read out of the memory medium itself realizes the functions of the aforementioned embodiments. Thus, the program code and the memory medium storing the program code constitute the invention in this case.

As the memory medium to supply the program code, for example, a floppy (registered trademark) disk, a hard disk, a magnetic optical disc, an optical disc such as a CD-ROM, a CD-R, a CD-RW, a DVD-ROW, a DVD-RAM, a DVD-RW, and a DVD+RW, a magnetic tape, a nonvolatile memory card, a ROM, and the like can be used. Alternatively, a program code may be downloaded through the network.

The functions of the aforementioned embodiments are realized not only by executing the program code read out by the computer, but by an OS (operating system) or the like which operates on the computer and manages a part or all of the actual processes.

Further, the program code read out of the memory medium may be read in a memory provided in a function expansion board inserted in the computer or a function expansion unit connected to the computer. A CPU or the like provided in the expansion board and the expansion unit may manage a part or all of the actual expansion process based on the instructions of the program code, thereby the functions of the aforementioned embodiments may be realized as well.

According to another aspect of the invention, a conductive film is used as a process layer, a reflection preventive film is used as an intermediate layer, a photoresist film is used as a mask layer, and a CF-based gas is used as a deposit gas. The CF-based gas especially generates a particle easily, therefore, a material is certainly deposited at an aperture of the photoresist film by etching the reflection preventive film with plasma generated from the CF-based gas. Therefore, a width of the aperture in the photoresist film can be certainly narrowed.

According to another aspect of the invention, a high frequency power is supplied to a mounting stage on which the substrate is mounted, which is provided in a process chamber to hold the substrate. Therefore, in etching the intermediate layer by plasma generated from a deposit gas, a material is not deposited on a surface of the mask layer and a bottom surface of the aperture due to sputtering of ions and the like. As a result, the material can be deposited only on the side surface of the aperture.

According to another aspect of the invention, an end point of etching applied to the intermediate layer is detected. A material starts to be deposited on the side surface of the aperture after etching the intermediate layer. Therefore, a start point of the deposition of the material can be detected.

According to another aspect of the invention, after the endpoint of the etching applied to the intermediate layer is detected, the aperture is exposed to plasma generated from the deposit gas for a predetermined time. Therefore, a width of the aperture can be precisely controlled.

According to another aspect of the invention, a halogen-based gas is used to generate plasma to etch the intermediate layer. When etching the intermediate layer, the plasma generated from the deposit gas causes roughness on the side surface of the aperture of the mask layer. On the other hand, plasma generated from the halogen-based gas smoothes the mask layer, which smoothes the roughness caused on the side surface of the aperture. As a result, the roughness caused on the side surface of the aperture can be smoothed before etching the process layer using the mask layer having the aperture as a mask. Thus, a striation can be prevented from being caused on the side surface of the aperture formed by etching the process layer.

According to another aspect of the invention, a HBr gas is used as the halogen-based gas. Plasma generated from the HBr gas certainly smoothes the mask layer, therefore, roughness caused on the side surface of the mask layer by etching the intermediate layer can be certainly smoothed.

The mask layer is left with a predetermined thickness over the intermediate layer when the isotropic etching step to the intermediate layer or the like starts. Therefore, with the left mask layer, only the width of the intermediate layer can be certainly reduced by preventing the intermediate layer from being etched in a direction of the thickness in the isotropic etching step applied to the intermediate layer or the like.

According to another aspect of the invention, a COR treatment using a hydrogen fluoride gas and an ammonia gas is applied to a side surface of a layer including silicon. By the COR treatment, the layer including silicon is etched by a chemical reaction to generate a product from the layer including silicon. The chemical reaction proceeds in an isotropic manner, therefore, the layer including silicon can be certainly etched by the COR treatment in the isotropic manner.

A position of the first aperture corresponds to a position of the mask film. A position of the second aperture corresponds to a position of the second intermediate layer with the narrowed width. Therefore, the first and second apertures do not contact with each other. As a result, the apertures can be formed with a narrower pitch in the process layer.

When the intermediate layer isotropic etching step starts, at least the third intermediate layer is left with the predetermined thickness over the second intermediate layer. Therefore, the third intermediate layer prevents the second intermediate layer from being etched in a direction of the thickness in the intermediate layer isotropic etching step. As a result, only the width of the second intermediate layer can be certainly reduced.

A position of the first aperture corresponds to a position of the aperture of the mask layer. A position of the second aperture corresponds to a position of the second intermediate layer with the narrowed width. Therefore, the first and second apertures do not contact with each other. As a result, the apertures can be formed in the process layer with a narrower pitch.

When the intermediate layer isotropic etching step starts, at least the third intermediate layer is left with the predetermined thickness over the second intermediate layer. Therefore, the third intermediate layer prevents the second intermediate layer from being etched in a direction of the thickness in the intermediate layer isotropic etching step, thereby only the width of the second intermediate layer can be certainly reduced.

The present application is based on Japanese Priority Applications No. 2007-265596 filed on Oct. 11, 2007, and No. 2008-105784 filed on Apr. 15, 2008 with the Japanese Patent Office, and U.S. Patent Application No. 61/017,262 filed on Dec. 28, 2007 with the United States Patent and Trademark Office, the entire contents of which are hereby incorporated by reference.

The invention claimed is:

1. A substrate processing method to process a substrate including at least a base layer, a process layer, a first intermediate layer, and a first mask layer stacked in this order, the first mask layer including a first aperture configured to expose a portion of the first intermediate layer, the substrate processing method comprising:
a first material deposition step of depositing a material on a side surface of the first aperture and exposing a portion of the process layer by etching the exposed portion of the first intermediate layer by plasma generated from a deposit gas;
a first etching step of forming a second aperture configured to expose a portion of the base layer by etching the exposed portion of the process layer;
an ashing step of ashing the first intermediate layer and the first mask layer which are stacked over the process layer;
a layer stacking step of stacking a second intermediate layer and a second mask layer in this order, the second mask layer having a third aperture configured to expose a portion of the second intermediate layer except for over the second aperture;
a second material deposition step of depositing a material on a side surface of the third aperture and exposing another portion of the process layer by etching the second intermediate layer which is exposed by another plasma generated from another deposit gas; and
a second etching step of etching said another exposed portion of the process layer.

2. A substrate processing method to process a substrate including at least a process layer, an intermediate layer, and a mask layer stacked in this order and the mask layer including an aperture configured to expose a portion of the intermediate layer, the substrate processing method comprising:
an intermediate layer anisotropic etching step of applying anisotropic etching in a direction of a thickness to the exposed portion of the intermediate layer to expose the process layer;
an intermediate layer isotropic etching step of applying isotropic etching to the side surface of the intermediate layer, which is exposed by the anisotropic etching, to narrow a width of the intermediate layer;
a mask layer removing step of removing the mask layer;
a covering layer forming step of forming a covering layer configured to cover the exposed portion of the process layer and the intermediate layer with the narrowed width;
a covering layer removing step of removing a predetermined amount of the covering layer to expose only the intermediate layer with the narrowed width;
an intermediate layer removing step of selectively removing only the exposed intermediate layer to partially expose the process layer; and
a process layer etching step of applying anisotropic etching to the exposed process layer in a direction of a thickness, wherein the mask layer is left with a predetermined thickness over the intermediate layer when the intermediate layer isotropic etching step starts.

3. The substrate processing method as claimed in claim 2, wherein the intermediate layer is a layer including silicon, and a COR (Chemical Oxide Removal) treatment using a hydrogen fluoride gas and an ammonia gas is applied to the layer including silicon.

4. A substrate processing method to process a substrate including at least a process layer, a first intermediate layer, a second intermediate layer, a third intermediate layer, and a mask layer which are stacked in this order, the mask layer including an aperture configured to expose a portion of the third intermediate layer, the substrate processing method comprising:
a material deposition step of depositing a material on a side surface of the aperture and exposing a portion of the second intermediate layer by etching the exposed portion of the third intermediate layer by plasma generated from a deposit gas;
an intermediate layer anisotropic etching step of applying anisotropic etching in a direction of a thickness to the exposed portion of the second intermediate layer and to the first intermediate layer through the aperture of the mask layer to expose the process layer;
an intermediate layer isotropic etching step of applying isotropic etching to a side surface of the second intermediate layer, which is exposed by the anisotropic etching, to narrow a width of the second intermediate layer;
a third intermediate layer removing step of removing the mask layer and the third intermediate layer;
a covering layer forming step of forming a covering layer configured to cover the exposed process layer, the first intermediate layer, and the second intermediate layer with the narrowed width;
a covering layer removing step of removing a predetermined amount of the covering layer to expose only the second intermediate layer with the narrowed width;
a second intermediate layer removing step of selectively removing only the exposed second intermediate layer to partially expose the first intermediate layer;
a first intermediate layer etching step of applying anisotropic etching in a direction of a thickness to the exposed first intermediate layer to expose the process layer;
a covering layer complete removing step of completely removing the covering layer to expose the process layer covered with the covering layer; and
a process layer etching step of applying anisotropic etching in a direction of a thickness to the process layer which is exposed in the first intermediate layer etching step and the covering layer removing step,
wherein at least the third intermediate layer is left with a predetermined thickness over the second intermediate layer when the intermediate layer isotropic etching step starts.

5. The substrate processing method as claimed in claim 4, wherein the second intermediate layer is a layer including silicon, and a COR treatment using a hydrogen fluoride gas and an ammonia gas is applied to the layer including silicon in the intermediate layer isotropic etching step.

6. A substrate processing method to process a substrate including at least a process layer, a first intermediate layer, a second intermediate layer, a third intermediate layer, and a mask layer which are stacked in this order, the mask layer including an aperture configured to expose a portion of the third intermediate layer, the substrate processing method comprising:

a first covering layer forming step of forming a first covering layer to cover the mask layer and the exposed portion of the third intermediate layer in an isotropic manner;

a first covering layer etching step of applying anisotropic etching in a direction of a thickness to the first covering layer to expose the third intermediate layer again, leaving the first covering layer on a side surface of the aperture;

an intermediate layer anisotropic etching step of applying anisotropic etching in a direction of a thickness to the exposed third intermediate layer, the second intermediate layer, and the first intermediate layer through the aperture of the mask layer to expose the process layer and remove the mask layer;

an intermediate layer isotropic etching step of applying isotropic etching to a surface of the second intermediate layer, which is exposed by the anisotropic etching, to narrow a width of the second intermediate layer;

a third intermediate layer removing step of removing the third intermediate layer;

a second covering layer forming step of forming a second covering layer to cover the exposed process layer, the first intermediate layer, and the second intermediate layer with the narrowed width;

a second covering layer removing step of removing a predetermined amount of the second covering layer to expose only the second intermediate layer with the narrowed width;

a second intermediate layer removing step of selectively removing only the exposed second intermediate layer to partially expose the first intermediate layer;

a first intermediate layer etching step of applying anisotropic etching in a direction of a thickness to the exposed first intermediate layer to expose the process layer;

a second covering layer complete removing step of completely removing the second covering layer to expose the process layer covered with the second covering layer; and a process layer etching step of applying anisotropic etching in a direction of a thickness to the process layer exposed in the first intermediate layer etching step and the second covering layer complete removing step, wherein at least the third intermediate layer is left with a predetermined thickness over the second intermediate layer when the intermediate layer isotropic etching step starts.

7. The substrate processing method as claimed in claim 6, wherein the second intermediate layer is a layer including silicon; and a COR treatment using a hydrogen fluoride gas and an ammonia gas is applied to the layer including silicon in the intermediate layer isotropic etching step.

* * * * *